(12) United States Patent
Asakawa et al.

(10) Patent No.: US 7,445,881 B2
(45) Date of Patent: Nov. 4, 2008

(54) METHOD OF MANUFACTURING SEMICONDUCTOR DEVICE, ACID ETCHING RESISTANT MATERIAL AND COPOLYMER

(75) Inventors: Koji Asakawa, Tokyo (JP); Kenichi Ohashi, Kawasaki (JP); Akira Fujimoto, Kawasaki (JP); Takashi Sasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/679,660

(22) Filed: Feb. 27, 2007

(65) Prior Publication Data

US 2007/0138139 A1    Jun. 21, 2007

Related U.S. Application Data

(62) Division of application No. 11/056,094, filed on Feb. 14, 2005, now Pat. No. 7,208,334.

(30) Foreign Application Priority Data

Mar. 31, 2004   (JP) .............................. 2004-108108
Jun. 11, 2004   (JP) .............................. 2004-173864

(51) Int. Cl.
*G03C 1/00*    (2006.01)
*G03C 7/00*    (2006.01)

(52) U.S. Cl. .................... 430/270.1; 430/326; 430/327; 430/328; 430/329; 430/330

(58) Field of Classification Search .............. 430/270.1, 430/326–330

See application file for complete search history.

(56) References Cited

U.S. PATENT DOCUMENTS 5,997,952 A    12/1999   Harris et al.

(Continued)

FOREIGN PATENT DOCUMENTS

JP            4-354382          12/1992

(Continued)

OTHER PUBLICATIONS

Wolf et al., Silicon Processing for the VLSI Era, 1986, vol. 1, pp. 452-453.*

(Continued)

*Primary Examiner*—Duy-Vu N Deo
(74) *Attorney, Agent, or Firm*—Oblon, Spivak, McClelland, Maier & Neustadt, P.C.

(57) ABSTRACT

Disclosed is an acid etching resistance material comprising a compound having a repeating unit represented by the following general formula (1):

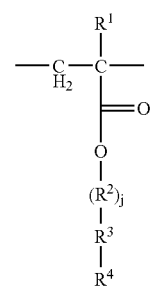

(1)

(in the general formula (1), $R^1$ is a hydrogen atom or methyl group; $R^3$ is a cyclic group selected from an alicyclic group and an aromatic group; $R^4$ is a polar group; $R^2$ is a group represented by the following general formula (2); and j is 0 or 1):

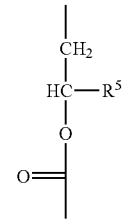

(2)

(in the general formula (2), $R^5$ is a hydrogen atom or methyl group).

39 Claims, 8 Drawing Sheets

Main chain (acryl) (structure retaining)   Alicyclic or aromatic ring (hydrofluoric resistance)   Hydroxyl or carboxyl group (adhesion to substrate)

U.S. PATENT DOCUMENTS

| | | | |
|---|---|---|---|
| 6,270,941 B1 * | 8/2001 | Yasunami | 430/270.1 |
| 6,280,897 B1 | 8/2001 | Asakawa et al. | |
| 6,287,746 B1 * | 9/2001 | Nakano et al. | 430/270.1 |
| 6,440,636 B1 | 8/2002 | Ushirogouchi et al. | |
| 6,451,501 B1 | 9/2002 | Nozaki et al. | |
| 6,673,513 B2 | 1/2004 | Choi et al. | |
| 6,791,117 B2 | 9/2004 | Yoshitake et al. | |
| 6,824,957 B2 | 11/2004 | Okino et al. | |
| 6,825,056 B2 | 11/2004 | Asakawa et al. | |
| 6,833,230 B2 | 12/2004 | Choi | |
| 6,946,233 B2 | 9/2005 | Nishi et al. | |
| 2002/0187420 A1 * | 12/2002 | Barclay et al. | 430/270.1 |
| 2004/0063024 A1 * | 4/2004 | Khojasteh et al. | 430/270.1 |
| 2004/0202961 A1 | 10/2004 | Takechi et al. | |
| 2005/0031990 A1 | 2/2005 | Okino et al. | |
| 2005/0031991 A1 | 2/2005 | Okino et al. | |
| 2005/0037283 A1 | 2/2005 | Okino et al. | |
| 2005/0037284 A1 | 2/2005 | Okino et al. | |
| 2005/0048400 A1 | 3/2005 | Okino et al. | |
| 2005/0059787 A1 | 3/2005 | Benoit et al. | |

FOREIGN PATENT DOCUMENTS

| | | |
|---|---|---|
| JP | 8-29636 | 2/1996 |
| JP | 2000-98612 | 4/2000 |
| JP | 2000-133837 | 5/2000 |
| JP | 2000-299494 | 10/2000 |
| JP | 2001-240625 | 9/2001 |
| JP | 2003-234290 | 8/2003 |

OTHER PUBLICATIONS

U.S. Appl. No. 11/679,754, filed Feb. 27, 2007, Asakawa, et al.
U.S. Appl. No. 11/679,660, filed Feb. 27, 2007, Asakawa, et al.

* cited by examiner

METHOD OF MANUFACTURING SEMICONDUCTOR DEVICE, ACID ETCHING RESISTANT MATERIAL AND COPOLYMER

CROSS-REFERENCE TO RELATED APPLICATIONS

This application is based upon and claims the benefit of priority from prior Japanese Patent Applications No. 2004-108108, filed Mar. 31, 2004; and No. 2004-173864, field Jun. 11, 2004, the entire contents of both of which are incorporated herein by reference.

BACKGROUND OF THE INVENTION

1. Field of the Invention

This invention relates to a method of manufacturing a semiconductor device, to an acid etching resistance material, and to a copolymer.

2. Description of the Related Art

A compound semiconductor to be employed for constituting a light emitting element is generally very high in refractive index, so that most light emitting elements suffer loss of light due to the reflection of light at the surface or interface thereof. Therefore, it has been difficult to externally retrieve the light that has been generated inside the light emitting elements at a high efficiency. In the case of compounds such as gallium phosphide, the refractive index thereof is as high as 3.5 or so, so that because of the total reflection thereof, only 19% of incident light can be taken out. To cope with this problem, it is usual conducted to form, as an antireflection layer, a monolayer film having a refractive index of about 1.5 on the surface of a light emitting element. However, since the difference in refractive index between the light-emitting surface and the monolayer film is relatively large, the light emitting element constructed as described above is still insufficient to overcome the aforementioned problem.

As a measure for enhancing the light extracting efficiency, there is known a method wherein the surface of light emitting element is roughened to increase the surface area of the light emitting element, thus enhancing the external quantum yield. The roughening of the surface of light emitting element can be generally performed by surface treatment using an etching solution comprising hydrochloric acid, sulfuric acid, hydrofluoric acid, hydrogen peroxide or a mixture thereof. In this case, since a specific crystal face of compound semiconductor corrades when the compound semiconductor is subjected to wet etching, a pattern of triangular pyramid-like configuration having a size of the order of μm would be formed depending on crystal face. As a result, the surface area of the light emitting element is increased, resulting in an increase of the light extracting efficiency and hence the enhancement of luminance.

The surface-roughening treatment by this chemical etching is called a "frosting treatment" and can be executed by a very simple technique, i.e., by simply dipping a compound semiconductor in an etching solution. More specifically, this frosting treatment is performed with the entire surfaces of the compound semiconductor substrate, excluding the surface where the roughening is taken place, being covered with a protecting film so as to prevent the electrodes, for instance, from being contacted with etching solution. The protecting film to be employed herein is required to be such that it can be easily removed after finishing the frosting treatment and at the same time, it is resistive to the etching solution. However, no one has succeeded as yet to obtain a material having such characteristics as described above.

Meanwhile, there is known an optical pattern etching method which is a fine fabrication technique for etching a substrate so as to form an optical pattern on the surface thereof, this optical pattern etching method comprising a step of coating a photosensitive hydrofluoric acid etching resist material on the substrate, a step of exposure, a step of development, and a step of etching. This optical pattern etching method is one of elemental techniques to be employed in the manufacture of a large-scale integrated circuit (LSI) substrate and is also applied to the manufacture of a micro-electromechanical system (MEMS) of optical scanning apparatus, and the manufacture of semiconductor devices such as a light-emitting diode (LED) in recent years.

In particular, the etching step using hydrofluoric acid in the aforementioned optical pattern etching method is expected to be applicable to the etching of a sacrificial layer of an optical scanning apparatus having a movable element structure and provided with an optical waveguide which is low in hydrofluoric acid resistance, or to the frosting treatment of LED for enhancing the light extracting efficiency through the roughening of the surface of light emitting element made from a compound semiconductor. In this case, in order to shorten the running time of the manufacturing method, it is desirable to employ concentrated hydrofluoric acid (for example 49%) in the etching step.

However, the manufacture of an LSI substrate is mainly performed by etching using dilute hydrofluoric acid due to the facts that the conventional photo-sensitive etching material that has been developed for the manufacture of LSI substrate is poor in resistance to hydrofluoric acid and that a photosensitive hydrofluoric acid etching resist material to which concentrated hydrofluoric acid can be applicable is not yet available. Accordingly, if concentrated hydrofluoric acid etching is to be performed, the portions which are made of a material poor in hydrofluoric acid resistance are required to be formed after finishing the step of hydrofluoric acid etching, thus raising problems that the manufacturing process is complicated and the manufacturing period is prolonged.

BRIEF SUMMARY OF THE INVENTION

According to one aspect of the present invention, there is provided a method of manufacturing a semiconductor device comprising a semiconductor substrate having a first electrode provided above the rear surface thereof and roughened side surfaces; a light emitting layer formed above the semiconductor substrate; and a second electrode provided above the light emitting layer or above the rear surface; said method comprising:

forming a protective film above an entire surfaces of the semiconductor substrate including the first electrode, the light emitting layer and the second electrode, excluding the side surfaces, the protective film comprising an acid etching resistance material having a repeating unit represented by the following general formula (1):

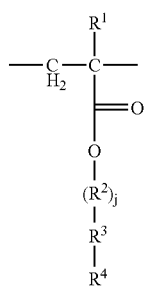

(1)

(in the general formula (1), $R^1$ is a hydrogen atom or methyl group; $R^3$ is a cyclic group selected from an alicyclic group and an aromatic group; $R^4$ is a polar group; $R^2$ is a group represented by the following general formula (2); and j is 0 or 1:

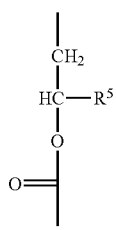

(2)

(in the general formula (2), $R^5$ is a hydrogen atom or methyl group);

treating the semiconductor substrate having the protective film formed thereof with an acidic etching solution; and removing the protective film with an alkaline solution.

According to another aspect of the present invention, there is provided an acid etching resistance material comprising a compound having a repeating unit represented by the following general formula (1):

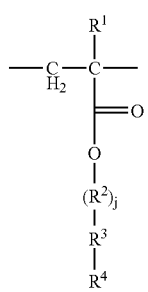

(1)

(in the general formula (1), $R^1$ is a hydrogen atom or methyl group; $R^3$ is a cyclic group selected from an alicyclic group and an aromatic group; $R^4$ is a polar group; $R^2$ is a group represented by the following general formula (2); and j is 0 or 1):

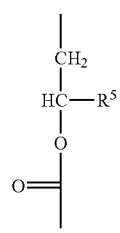

(2)

(in the general formula (2), $R^5$ is a hydrogen atom or methyl group).

According to another aspect of the present invention, there is provided a copolymer comprising:

40 to 70 mol % of 3-hydroxy-1-methacryloyloxy-adamantane represented by the following chemical formula (A2); and the balance of 2-acryloyloxypropyl phthalate represented by the following chemical formula (A4):

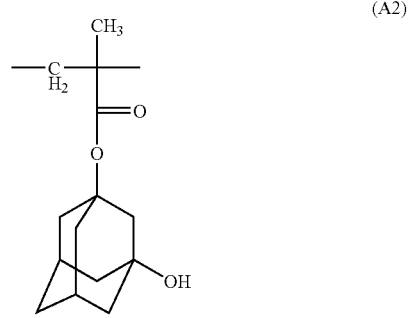

(A2)

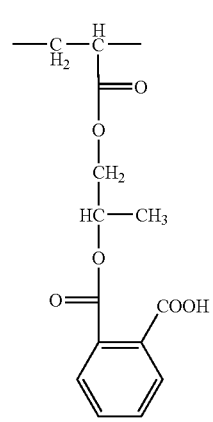

(A4)

According to another aspect of the present invention, there is provided an acid etching resistance material comprising:

a resin having at least two kinds of repeating units represented by the following general formula (PS1); and a photo acid generator which is capable of generating an acid as it is irradiated with light:

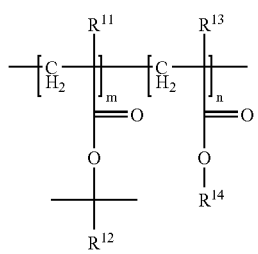

(PS1)

(in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone groups; and m and n represent individually a natural number).

According to another aspect of the present invention, there is provided a method of manufacturing a semiconductor device comprising:

forming a layer of a photosensitive etching resistance material on a substrate made of semiconductor or quartz glass, the photosensitive etching resistance material comprising an acid etching resistance material composed of a resin having at least two kinds of repeating units represented by the following general formula (PS1); and a photo acid generator which is capable of generating an acid as it is irradiated with light:

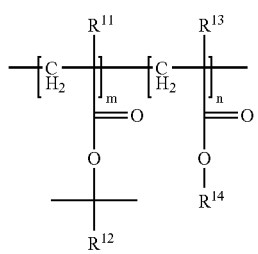

(PS1)

(in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone groups; and m and n represent individually a natural number):

subjecting the substrate to patterning exposure;

heating the substrate;

subjecting the substrate to a developing treatment using an alkaline developing solution; and subjecting the substrate to a fluoric acid etching treatment using a solution containing fluoric acid at a concentration ranging from 30% to 50%.

According to another aspect of the present invention, there is provided a method of manufacturing a semiconductor device comprising:

forming a sacrificial layer composed of quartz glass on a semiconductor substrate;

forming an element structure composed of semiconductor on the sacrificial layer;

forming a region composed of a material which is poor in hydrofluoric acid resistance on the semiconductor substrate;

covering the region composed of a material which is poor in hydrofluoric acid resistance with a photosensitive etching resistance material comprising an acid etching resistance material composed of a resin having at least two kinds of repeating units represented by the following general formula (PS1); and a photo acid generator which is capable of generating an acid as it is irradiated with light:

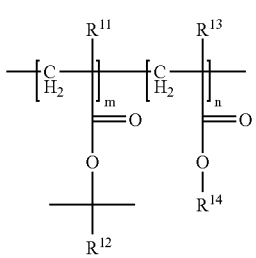

(PS1)

(in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone groups; and m and n represent individually a natural number); and removing the sacrificial layer by applying a hydrofluoric acid solution to the semiconductor substrate.

According to another aspect of the present invention, there is provided a method of manufacturing a semiconductor device comprising:

forming a region of a material which is excellent in hydrofluoric acid resistance on a semiconductor substrate;

forming a region of a material which is poor in hydrofluoric acid resistance over the region which is composed of a material which is excellent in hydrofluoric acid resistance;

covering the region which is poor in hydrofluoric acid resistance with a photosensitive etching resistance material comprising an acid etching resistance material composed of a resin having at least two kinds of repeating units represented by the following general formula (PS1); and a photo acid generator which is capable of generating an acid as it is irradiated with light:

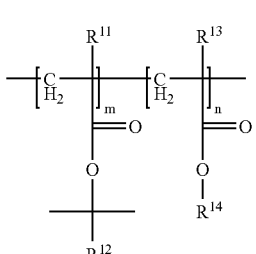

(PS1)

(in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone groups; and m and n represent individually a natural number); and subjecting the region which is composed of a material which is excellent in hydrofluoric acid resistance to an etching treatment using a solution of hydrofluoric acid.

DETAILED DESCRIPTION OF THE INVENTION

Figure 1:
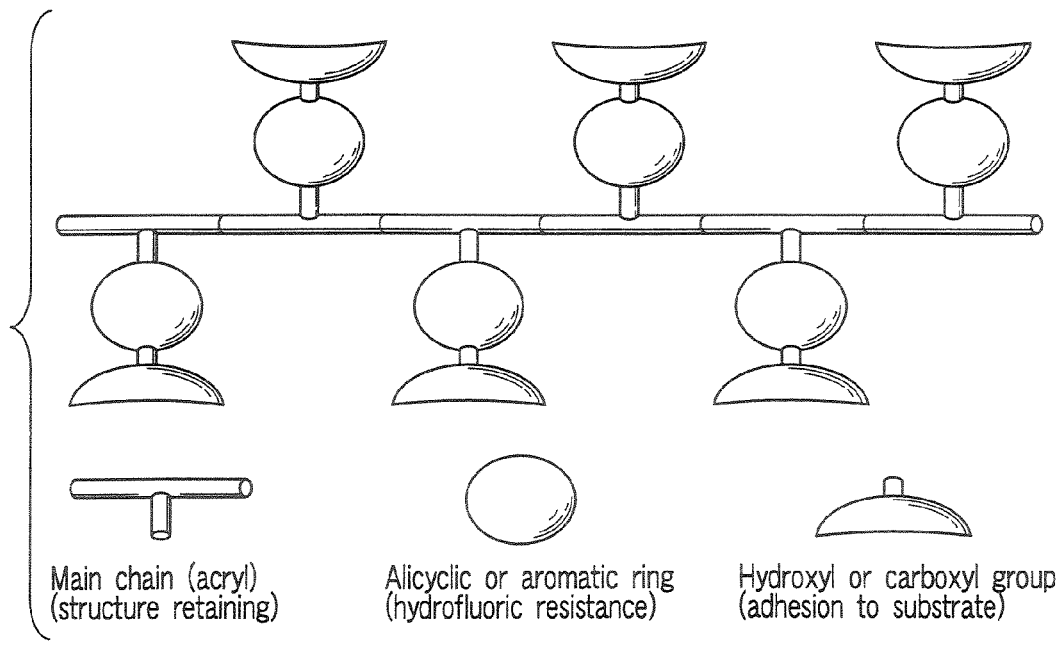
FIG. 1 is a diagram schematically illustrating the design manual for molecular design according to one embodiment of the present invention.

Specific embodiments of the present invention will be explained as follows.

EMBODIMENT 1

The method of manufacturing a semiconductor device according to one embodiment of the present invention is applicable especially to the manufacture of a light emitting element. In the process of this manufacturing method of a light emitting element, a compound semiconductor substrate is treated with a mixed solution consisting of hydrochloric acid and hydrogen peroxide (hydrofluoric acid/hydrogen peroxide), and then surface-treated with concentrated hydrofluoric acid, thereby roughening the surface of the compound semiconductor substrate. By the term "concentrated hydrofluoric acid", it is intended to indicate a solution containing hydrofluoric acid at a concentration of 25% or more. It is desirable, in order to enhance the emission efficiency of light emitting element, to employ a solution of hydrofluoric acid containing hydrofluoric acid at a very high concentration of 40% or more. Since this concentrated hydrofluoric acid is employed as an etching solution, a protective film to be employed in this case is required to be resistive not only to hydrochloric acid/hydrogen peroxide but also to concentrated hydrofluoric acid. Moreover, the protective film is required to be alkali-soluble so as to enable the protective film to be easily removed by using an alkaline solution subsequent to the surface-roughening treatment of semiconductors. As for the alkaline solution, it is possible to employ, for example, an alkaline developing solution for semiconductors (for example, a 2.38% aqueous solution of tetramethyl ammonium hydroxide (TMAH)). It is also possible to employ any kind of alkaline solution as long as it is adapted to be employed in the treatment of semiconductors.

In order to make the resin constituting the protective film alkali-soluble, the resin is required to be hydrophilic. There is a very narrow choice in finding a resin which is not only hydrophilic but also excellent in acid resistance. In particular, it is very difficult to find a material which is resistive to hydrofluoric acid and at the same time, excellent in alkali-solubility.

The present inventors have made extensive studies with a view to obtain a resin which can be employed as a protective film satisfying all of the aforementioned conditions.

Incidentally, as for specific examples of the polymeric materials which are resistive to both of hydrofluoric acid and hydrochloric acid, they include butyl rubber, fluororubber, polyethylene, polypropylene, acrylic resin, Teflon (registered trademark) (PTFE, ETFE), and phenolic resin. As for the fluororubber and Teflon, since there is no solvent available for them, they cannot be employed. As for polyethylene and polypropylene, although they are soluble in a chlorine-based solvent, they are not applicable to alkaline development since they are not provided with hydrophilic moiety at all. Further, because of bad influences to environments, most of hydrochloric acid-based solvents cannot be employed at present. Due to the aforementioned problems, resins which are expected to be useful are confined to acrylic resin and phenolic resin.

Phenolic resin is a resin which is now employed as an ordinary photoresist. For example, novolac can be employed as a photoresist for g-line or i-line. Polyhydroxystyrene (PHS) is employed as a photoresist for KrF excimer laser. Therefore, the ordinary photoresist (OFPR-800: Tokyo Ohka Co., Ltd., a mixture comprising novolac and naphthoquinone diazide (photosensitive agent)) and polymethylmethacrylate (PMMA) which is a representative acrylic resin were compared with each other at first with regard to the hydrofluoric acid resistance thereof.

Each of these resins was dissolved in propyleneglycol monomethyl ether acetate (PGMEA) to form a solution, which was then coated on a gallium phosphide substrate by spin coating method to form a resin layer. This resin layer was then immersed in concentrated fluoric acid for 20 minutes to perform the etching of the substrate. As a result, the OFPR-800 was removed from the substrate in about 5 minutes, and the resultant exposed surface of the substrate was turned cloudy due to the etching. On the other hand, to the PHS with 23% of hydroxyl group thereof being protected with t-butoxycarbonyl, 0.5% by weight of triphenylsulfonium trifluoromethane sulfonate was added to prepare a polyhydroxystyrene-based resist, which was then evaluated in the same manner as described above. As a result, it was found that when a resin layer comprising this resist was immersed in concentrated fluoric acid, the resin layer was peeled away from the substrate in about 5 minutes and at the same time, the resin was decomposed by the effect of the hydrofluoric acid. In the case of the PMMA however, even though the resin layer was peeled away from the substrate, the resin layer was floated in the hydrofluoric acid and to remain as it was without being decomposed for several tens minutes. It was confirmed that even in the case of PMMA having one of the simplest structures of acryl, the hydrofluoric acid resistance thereof was higher than that of the conventional resist.

As a result, it was determined that the main chain of a hydrofluoric acid resistance resin should be constituted by an acrylic backbone. Moreover, it is required that this acrylic main chain is protected so as not to be decomposed by the attack from hydrofluoric acid. It was found that this requirement could be met by introducing an alicyclic compound (alicyclic group) excellent in chemical stability or an aromatic ring excellent in chemical stability into a side chain of the resin.

As for specific examples of alicyclic hydrocarbon, they include, for example, cyclopentane, cyclohexane, cyclooctane, norbornane, isobornane, adamantane and tricyclodecane. It is also possible to employ cyclobutane ring, cyclopentane ring, cyclohexane ring, cycloheptane ring, cyclooctane ring, each of them comprising a bridging hydrocarbon, norbornane ring, adamantane ring, bornane ring, terpene ring such as menthane ring, etc. Among them, alicyclic hydrocarbon having a six-membered ring is more preferable due to the excellent chemical stability thereof, specific examples of such alicyclic hydrocarbon including adamantane, norbornane, isobornane, tricyclodecane and cyclohexane. An alicyclic compound having one or more crosslinking structures is known to have a hard structure which is close to that of diamond and also known to be very excellent in chemical stability. Therefore, the employment of adamantane, norbornane, isobornane and tricyclodecane is especially preferable. Further, as for specific examples of the aromatic ring, they include benzene ring and naphthalene ring. Since benzene ring is less bulky and is capable of suppressing the creation of spaces inside a high-molecular chain to make it possible to minimize free volume as compared with naphthalene ring, the employment of benzene ring is more preferable.

Although it is possible through the employment of alicyclic group and aromatic ring to protect the main chain of acrylic backbone from being attacked by hydrofluoric acid, these alicyclic group and aromatic ring are strong in hydrophobicity. Therefore, if the resin layer comprising any of these alicyclic group and aromatic ring is to be removed from the substrate, it is required to employ an organic solvent. In order to make the resin layer soluble in an ordinary resist developing solution while retaining the alkali-solubility of the resin layer, a polar group is further attached to a terminal of the side chain of polymer. As for the polar group useful in this case, it is possible to employ carboxyl group, hydroxyl group or ketone.

FIG. 1 illustrates the schematic design for molecular design, which meets the aforementioned conditions. As shown in FIG. 1, the main chain for retaining the entire structure of polymer is composed of an acrylic backbone, to which a cyclic group such as alicyclic group or aromatic ring is attached as a side chain, thereby enhancing the hydrofluoric acid resistance. Additionally, a polar group is linked to the cyclic group for securing the adherence of polymer to a substrate.

The acrylic resin having such a side chain can be synthesized according to the following flow chart for instance.

| ← Charging of monomers;
| ← Charging of AIBN, 1 mol %/monomer;
| ← Charging of THF, about three times based on the weight of the monomer;
| ← Replacement of atmosphere by a nitrogen atmosphere;
|
| → Reaction: performed for 40 hours at 60° C. in a nitrogen atmosphere;
|
| ← 2 mL of methanol is added to the reaction solution to eliminated radicals;
| ← While agitating the reaction solution in Erlenmeyer flask, hexane (2 to 3 times as much as THF) was added drop-wise to the reaction solution to form reprecipitate;
| The agitation is continued to turn the initially gel-like material into powder;
|
| → Solvent is removed by filtration;
| ← Vacuum drying (60° C. for 2-3 days);
| → Molecular weight is measured by GPC: when there is residual monomer, it is dissolved in THF to form reprecipitate;
|
| → Yield: 80-90%.

First of all, 0.01 mol of azobisisobutyronitrile (AIBN) was added as a polymerization initiator to a monomer to obtain a mixture, which was then diluted with tetrahydrofuran (THF) at a weight ratio of 2 to 3 times as much as the monomer. The resultant mixture was then agitated in a nitrogen atmosphere so as to allow a reaction to take place for 40 hours at a temperature of 60° C. To this resultant solution was added drop-wise n-hexane to allow a polymer component to precipitate to refine the polymer. Although a radical polymerization method is illustrated in the above embodiment, it is also possible to synthesize the same kind of acrylic resin by other methods such as cationic polymerization method and anionic polymerization method.

Cyclic groups such as the aforementioned alicyclic group and aromatic ring are highly bulky and are also expected to exhibit excellent resistance to hydrofluoric acid. Therefore, a cyclic group was introduced into the side chain of polymer in the synthesis of the acrylic resin. Since a lot of time is required if a multifunctional resin is to be synthesized from the beginning, resins were synthesized only for the purpose of examining the function of hydrofluoric acid resistance, the resins including poly(t-butylmethacrylate), poly(adamantylmethacrylate), poly(isobornylmethacrylate), poly(cyclohexanemethacrylate) and poly(phenoxyethylacrylate). Since these resins are poor in solubility to a solvent, it is difficult to obtain a flat film. Further, since these resins are highly hydrophobic, they cannot be dissolved in an alkaline solution.

Additionally, each of these resins are insufficient in adhesion to a substrate, however, these resins are sufficient to evaluate the resistance to hydrofluoric.

Then, each of the resins was dissolved in cyclohexane and the resultant solution was spin-coated on gallium phosphide substrate to form a film. Due to poor solubility of the resins, it was impossible to form a uniform film. However, it was possible to form samples of resin layers having a film thickness of about several micrometers. When these samples were immersed in a solution of concentrated hydrofluoric acid, bubbles were generated from the surfaces of these samples within about 5 seconds and then to peel away from the substrate as a fine strip of resin, thus the resin layer floated near the surface of the solution. Due to the fact that the pieces of resin thus kept floating existed as they were without being decomposed in the solution of concentrated hydrofluoric acid even after one hour, it was confirmed that these resins could not be decomposed by the effect of hydrofluoric acid.

The resins synthesized herein were peeled off due to the fact that they were in defect of a moiety which was capable of adhering to the substrate. However, with regard to the hydrofluoric acid resistance which was essential to these resins, there was no problem. As a result of above experiments, it has been found that even with a thin film made of acrylic resin, it is possible to make it sufficiently resistive to concentrated hydrofluoric acid if a structure which is capable of protecting the main chain is introduced into the side chain.

For the purpose of enhancing the adhesion of resin layer to a substrate, carboxyl group was introduced into an alicyclic compound suspended as the side chain. By introducing an acidic carboxyl group into the side chain, the resin layer was turned alkali-soluble, thereby making it possible to dissolve and remove the resin layer by using an alkaline developing solution. The polymers thus synthesized can be classified into four kinds, i.e., two kinds consisting of methacrylate where α-position thereof is constituted by methyl group and acrylate where α-position thereof is constituted by hydrogen atom; and two kinds consisting of a polymer where the side chain thereof is constituted by alicyclic group and a polymer where the side chain thereof is constituted by aromatic ring. The chemical structures of these four kinds of polymers are illustrated below.

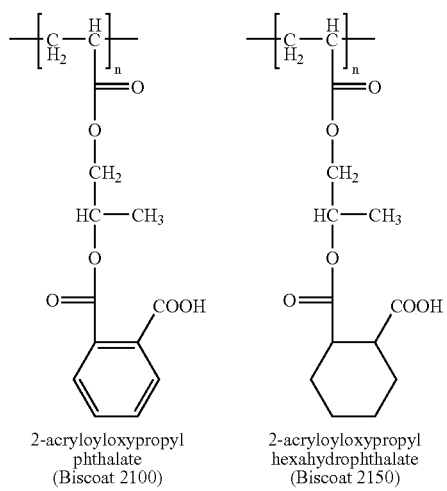

2-acryloyloxypropyl phthalate (Biscoat 2100)

2-acryloyloxypropyl hexahydrophthalate (Biscoat 2150)

-continued

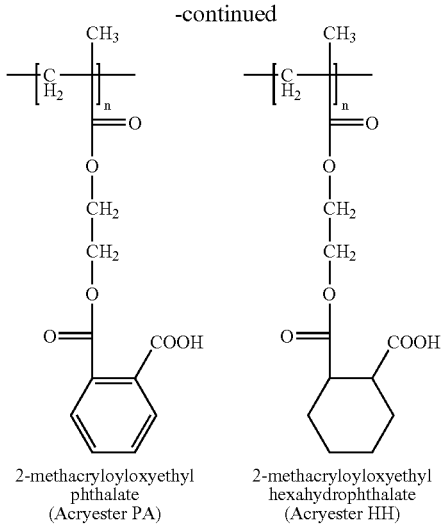

2-methacryloyloxyethyl phthalate (Acryester PA)

2-methacryloyloxyethyl hexahydrophthalate (Acryester HH)

As for two samples of methacrylate-based polymers, [A] 2-methacryloyloxyethyl phthalate (Acryester PA) and [B] 2-methacryloyloxyethyl hexahydrophthalate (Acryester HH) were obtained from Mitsubishi Rayon Co., Ltd. As for two samples of acrylate-based polymers, [C] 2-acryloyloxypropyl phthalate (Viscoat 2100) and [D] 2-acryloyloxypropyl hexahydrophthalate (Viscoat 2150) were obtained from Ohsaka Organic Chemical Industry Ltd. These monomers were polymerized according to the method illustrated in the aforementioned flowchart to obtain polymers.

Each of these polymers was investigated with respect to the solvent solubility, hydrofluoric acid resistance and alkali-solubility thereof. Each of the performances was evaluated according to the following criterions, the results obtained being summarized in the following Table 1.

(Solvent Solubility)
A: Solubility to the organic solvent was poor
B: More or less soluble to the organic solvent
C: Little problem with regard to solubility
D: No problem at all with regard to solubility
(Hydrofluoric Acid Resistance)
A: Impossible to measure
B: Relatively poor in hydrofluoric acid resistance
C: Fairly good in hydrofluoric acid resistance
D: Hydrofluoric acid resistance is more or less recognizable
(Alkali-Solubility)
A: None
B: Although soluble but incompletely
C: Soluble
D: Very good in solubility

TABLE 1

|  | Solvent solubility | Hydrofluoric acid resistance | Alkali-solubility |
|---|---|---|---|
| ViscoatViscoat 2100 | A | B | C |
| VViscoat 2150 | A | C | A |
| Acryester PA | D | — | — |
| Acryester HH | B | D | D~C |

Viscoat 2100 and Viscoat 2150 are almost the same in molecular structure and differ from each other only in the respect that the cyclic group that has been introduced into the side chain is whether aromatic ring (benzene ring) or an alicyclic group (cyclohexane ring). In the case where the chemical structure is similar to each other as described above, when these two kinds of monomers are mixed with each other so as to copolymerize them, the characteristics of the copolymer are frequently commensurate with the ratio of composition. In this case, when Viscoat 2100 which is relatively excellent in hydrofluoric acid resistance is copolymerized together with Viscoat 2150 which is very excellent in alkali-solubility, it is possible to obtain a resin provided with all of the aforementioned characteristics.

Viscoat 2100 and Viscoat 2150 were mixed together at various ratios to obtain five polymer samples. The Table 2, below illustrates mixing ratio (mol %) of the Viscoat 2100.

TABLE 2

| | Sample No. | | | | |
|---|---|---|---|---|---|
| | 1 | 2 | 3 | 4 | 5 |
| Ratio of Viscoat 2100 (mol %) | 100 | 75 | 50 | 25 | 0 |

Each of these polymers was dissolved in PGMEA to prepare a solution containing the polymer at a concentration of 30% by weight. The resultant solutions were respectively coated on gallium phosphide substrate by spin coating method at a rotational speed of 100 rpm to form a resin layer having a thickness of about 3 μm. When the substrates each having the resin layer formed thereon was immersed in concentrated hydrofluoric acid for 20 minutes, the resin films of the samples Nos. 1, 2 and 3 were turned cloudy. In order to ensure the hydrofluoric acid resistance of the resin layer, the content of Viscoat 2100 should desirably be not less than 50 mol %. 20 minutes later, these samples were picked up from the hydrofluoric acid and washed with pure water and dried. As a result, it was confirmed that the thickness of the resin layer was not changed at all in every samples, thus indicating that the resin itself could not be decomposed by the concentrated hydrofluoric acid. When the removal of the resin layer through the dissolution thereof was tried by using an alkaline developing solution (AD-10; Tama Kagaku Co., Ltd.), the resin layer in samples 4 and 5 was dissolve in the order of several seconds. However, it took several minutes in dissolving the resin layer as the content of Viscoat 2100 was increased.

When these samples were immersed in the alkaline developing solution immediately after these samples were immersed in the concentrated hydrofluoric acid, the resin layer was completely dissolved within one minute in all of the samples. However, when these samples were once dried after the immersion thereof in the concentrated hydrofluoric acid, it took about one hour in dissolving the resin layer especially when the content of Viscoat 2100 was increased as in the case where the dissolution of resin layer was tried immediately after the coating thereof. The reason for this may be attributed to the fact that the alkaline developing solution penetrated into the resin layer as the resin layer was swelled in the concentrated hydrofluoric acid, thus enabling the resin layer to be dissolved also from the interior thereof. Especially when the content of Viscoat 2100 was increased to 50 mol % or more, there was not visually recognized any corrosion of substrate in the gallium phosphide substrates from which the resin layer dessolved in the alkaline developing solution. Therefore, it is desirable that the content of Viscoat 2100 in the resin is increased to 50 mol % or more in order to secure a sufficient hydrofluoric acid resistance. When the content of Viscoat 2100 is 100 mol % (Sample 1) however, the viscosity of the solution would become too high so that the film coated on the substrate is more likely to shrink. Therefore, it is considered that an optimum mixing ratio of Viscoat 2100 would be about 75 mol %.

Then, acrylic resins where adamantane ring was introduced into the side chain of polymer were synthesized according to the aforementioned flowchart. The chemical structures of the resins thus obtained are as shown below.

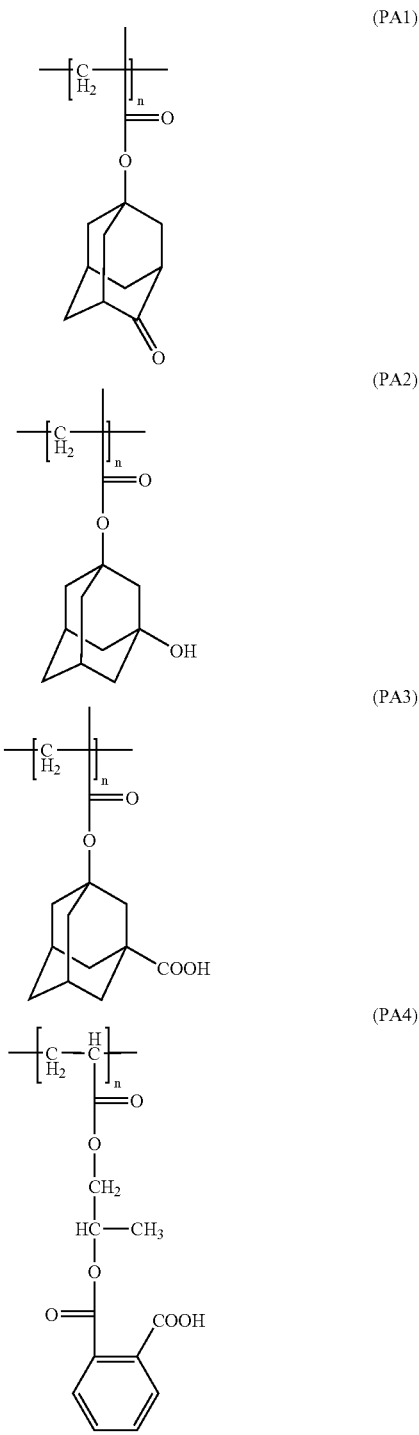

Each of the resins and the monomers thereof are summarized below.

(PA1): 5-methacryloyloxy-adamanthan-2-one (A1)
(PA2): 3-hydroxy-1-methacryloyloxy-adamantane (A2)
(PA3): 3-carboxy-1-methacryloyloxy-adamantane (A3)
(PA4): 2-acryloyloxypropyl phthalate (Viscoat 2100, A4)

Each of these resins was investigated with respect to the solvent solubility, hydrochloric acid (+hydrogen peroxide) resistance, hydrofluoric acid resistance, neutralizing solution resistance and alkali-solubility thereof. The results obtained are summarized in the following Table 3. Incidentally, the solvent solubility, hydrofluoric acid resistance and alkali-solubility thereof were evaluated according to the same criterions as described above. The hydrochloric acid (+hydrogen peroxide) resistance was evaluated according to the following criterion. With respect to characteristics of Viscoat 2100, the evaluation thereof was performed in the same manner as described above.

(Hydrochloric Acid (+Hydrogen Peroxide) Resistance; Resistance)

A: Resistive to both of these materials
B: Not resistive to hydrofluoric acid/hydrogen peroxide, but resistive to hydrofluoric acid
C: Resistive to hydrofluoric acid/hydrogen peroxide, and also weakly resistive to hydrofluoric acid
D: Not resistive to both of these materials

TABLE 3

|  | (HPA1) | (HPA2) | (HPA3) | (HPA4) |
|---|---|---|---|---|
| Solvent solubility | B | C | D | B |
| hydrofluoric acid resist. (+hydrogen peroxide) | D | B | D | B |
| Hydrofluoric acid resist. Neutralizing liquid resist. | A | B | D | C |
| Alkali-solubility | D | D | A | A |

The reason for the incapability of (PA1) of resisting hydrochloric acid is assumed to be attributed to the fact that ketone (=O) was decomposed due to effect of the acid. However, when content of the monomer (A1) was 50 mol % or more, the resultant resin exhibited excellent resistance against both of hydrofluoric acid and neutralizing liquid.

In the case of (PA2) where hydroxyl group was bonded to a terminal of adamantane, although it was more or less resistive to hydrofluoric acid, it was incapable of substantially resisting hydrofluoric acid as it was employed singly. (PA2) was sufficiently capable of resisting hydrochloric acid, and it was possible, through a combination thereof with other kinds of polymers, to make it to exhibit solubility to a solvent.

In the case of (PA3) which was carboxylic acid-based, although it exhibited excellent alkali-solubility, the polarity thereof was too high so that it was not dissolved in an ordinary resist solvent adapted to be employed in a spin coating. Further, due to high crystallinity of (PA3), the thin film thereof formed by spin coating subsequently crystallized, thus the thin film fractured.

In the case of (PA4), although the neutralizing liquid penetrated therein, it was possible to dissolve it in the developing solution by increasing the mixing ratio of the monomer (A4) up to 30 mol % or more.

Therefore, it was determined to employ the carboxylic acid-based monomer which was excellent in adhesion to the substrate and in alkali-solubility in combination with the monomer (A4) which was found excellent in adhesion to the substrate as a result of studies in Example 1. The copolymer thus obtained was a random polymer where these monomers were incorporated in a chain at random at a certain ratio.

In the foregoing examples, acrylic resin containing adamantane was explained. However, since an alicyclic compound having one or more cross-linking structures is very excellent in chemical stability, it is possible to obtain the same results as described above even if any of norbornane, isobornane and tricyclodecane is employed.

The kinds of monomers included in each of the copolymers are summarized in the Table 4, below.

TABLE 4

|  | Copolymers | | | |
|---|---|---|---|---|
|  | C1 | C2 | C3 | C4 |
| Monomers | A1, A2 | A1, A2, A4 | A1, A4 | A2, A4 |

The copolymers thus obtained were investigated with respect to the resistance thereof to concentrated hydrofluoric acid (49%), an aqueous mixture consisting of hydrochloric acid and hydrogen peroxide (3% hydrogen peroxide), a hydrofluoric acid-neutralizing solution ($NH_4HCO_3$), and an alkaline developing solution for photoresist (a 2.38% aqueous solution of TMAH), the results being summarized as follows.

In the case of the copolymer (C1), it was excellent in both hydrofluoric acid resistance and hydrochloric acid resistance. Although the penetration of the neutralizing liquid was not recognized, it was impossible to dissolve the copolymer in the developing solution.

In the case of the copolymer (C2), the penetration of the neutralizing liquid was not recognized. It was found out that in order to obtain a copolymer which was capable of satisfying hydrofluoric acid resistance, hydrochloric acid resistance and alkali-solubility, the mixing ratios of all of the monomers were required to be adjusted. For example, in order to provide the copolymer with hydrofluoric acid resistance, the mixing ratio of A1 was required to be 50 mol % or more. In order to provide the copolymer with hydrochloric acid resistance, a total mixing ratio of A2+A4 was required to be 60 mol % or more. Further, when mixing ratio of A4 was 30 mol % or more, it was possible to dissolve the resultant copolymer in the alkaline developing solution in 10 minutes.

In the case of the copolymer (C3), it exhibited a certain degree of hydrofluoric acid resistance and the penetration of the neutralizing solution was not recognized. However, it was found poor in hydrochloric acid resistance and was impossible to dissolve the copolymer in the developing solution.

In the case of the copolymer (C4), it was found poor in hydrofluoric acid resistance but was satisfactory in hydrofluoric acid resistance and was capable of being dissolved in the developing solution.

It was found from the results mentioned above that a resin having the monomer (A1) incorporated therein at a ratio of about 50 mol % was capable of exhibiting a high hydrofluoric acid resistance. Further, a copolymer having monomers (A1) and (A2) incorporated therein at a ratio of 50:50 (mol/mol) was capable of withstanding in concentrated hydrofluoric acid for 60 minutes. However, the ketone-based acrylic resin decomposed in a strong acid such as hydrochloric acid, thus failing to exhibit a sufficient degree of hydrochloric acid resistance.

Among the aforementioned copolymers, the copolymers (C2) and (C4) exhibited much possibility of hydrochloric acid resistance and a certain degree of hydrofluoric acid resistance. As for the combination of monomers in these copolymers, it was composed of (A1+)A2+A4. Accordingly, the mixing ratios of these monomers were altered in the synthesis of these copolymers, and the hydrofluoric acid resistance, hydrochloric acid resistance and alkali-solubility of these copolymers were investigated to obtain the results shown in FIG. 2.

It was possible, through increasing the mixing ratio of the monomer A1 (5-methacryloyloxy-adamantan-2-one), to improve the hydrofluoric acid resistance thereof. If it is desired to meet the specification of: 30 minutes in concentrated hydrofluoric acid, the monomer (A1) should be incorporated at a ratio of 50 mol %. However, since this monomer (A1) is poor in hydrochloric acid/hydrogen peroxide resistance, this monomer (A1) cannot be employed singly. Further, in order to secure a sufficient alkali-solubility, the monomer (A4) which is a segment containing carboxylic acid should be included at a ratio of 30 mol % or more.

As a result of further studies, it was found that the hydrofluoric acid resistance can be classified into two kinds, i.e. corrosion resistance to hydrofluoric acid and penetration resistance to hydrofluoric acid. More specifically, there are a couple of corrosion processes when a substrate is etched using hydrofluoric acid, i.e., a phenomenon where resin itself is corroded and decomposed; and a phenomenon where hydrofluoric acid enters into an interface between a substrate and a resin to erode the substrate even though the resin cannot be decomposed. A resin which is widely employed at present in the fine lithography of electronic device is novolac. A photoresist to be formed using this novolac is satisfactory in corrosion resistance to hydrofluoric acid. However, the photoresist is quite frequently poor in penetration resistance to hydrofluoric acid. As a result, hydrofluoric acid enters into an interface between a substrate and the resist film, and to corrode and peel off the resist film, thereby the substrate is attacked by the hydrofluoric acid.

The acrylic resin mentioned above is sufficiently resistive to the penetration of hydrofluoric acid into an interface between a substrate and a resin layer. On the other hand, due to the fact that novolac resist is excellent in corrosion resistance to hydrofluoric acid, it is expected that if a resist film is formed of a 2-ply layer comprising an acrylic resin layer and a novolac resin layer, the resist film would be also excellent in hydrofluoric acid resistance. In the formation of this 2-ply layer, it is conceivable that the acrylic resin layer is employed as a lower layer, on which the novolac resin is coated thereon to form an upper layer.

However, an organic solvent which is generally employed as a resist solvent dissolves ordinary polymers. Therefore, when a solution of novolac resin is spin-coated on an acrylic resin layer, this underlying acrylic resin would be dissolved by a resist solvent, thus making it impossible to satisfactorily coat the novolac resin to form a 2-ply layer.

To avoid the aforementioned inconvenience, it is required to select a solvent which is incapable of dissolving the aforementioned acrylic resin but is capable of dissolving novolac resin from the solvents adapted to be employed for photoresist, thereby dissolving the novolac resin. As a sample of acrylic resin, a copolymer comprising 50 mol % or more of the monomer (A2) and the balance of the monomer (A4) was synthesized to investigate the solubility of the copolymer to various resist solvents. As for the resist solvents employed herein, they included ethyl Cellosolve Acetate (ECA), propyleneglycol monomethyl ether acetate (PGMEA), cyclohexanone, methyl methacrylate (MMA), ethyl lactate (EL) and propyleneglycol methyl ether (PGME). The performance of these resist solvents was evaluated according to the following criterion.

○: It was possible to dissolve the resin, and irregularities of coating such as striation were not recognized on the occasion of spin coating.

X: It was impossible to dissolve the resin, and irregularities of coating such as striation were recognized on the occasion of spin coating.

The results obtained are summarized in the Table 5, below.

TABLE 5

| ECA | X |
|---|---|
| PGMEA | X |
| cyclohexanone | ○ |
| MMA | X |
| EL | ○ |
| PGME | ○ |

In the case of cyclohexanone, it took a lot of time in dissolving the copolymer. In the case of EL, the wettability thereof to a wall surface was somewhat poor.

It was found that the copolymer comprising the monomers (A2) and (A4) was incapable being dissolved in PGMEA or MMA as long as the content of the monomer (A2) was 50 mol % or more. Namely, as long as the solvent for the resist to be lap-coated is confined to PGMEA or MMA, it is possible to form a 2-ply structure since the acrylic resin is prevented from being dissolved. Especially, since PGMEA is employed widely as a solvent for resists in the market, there are many varieties in the selection of photo resist using PGMEA as a solvent. Therefore, whether or not the PGMEA can be employed as a solvent for a resist can be easily confirmed by watching the catalog thereof or MSDS.

When it is desired to spin-coat the aforementioned acrylic resin, a solvent selected from cyclohexanone, PGME and EL can be employed. In the cases of cyclohexanone and EL however, irregularities of coating called striation directed normal to the spinning direction were recognized after the spin coating due to somewhat inferior solubility of the resin to these solvents. In view of this, PGME which was excellent in coating properties was employed as a solvent for this resin.

Figure 2:
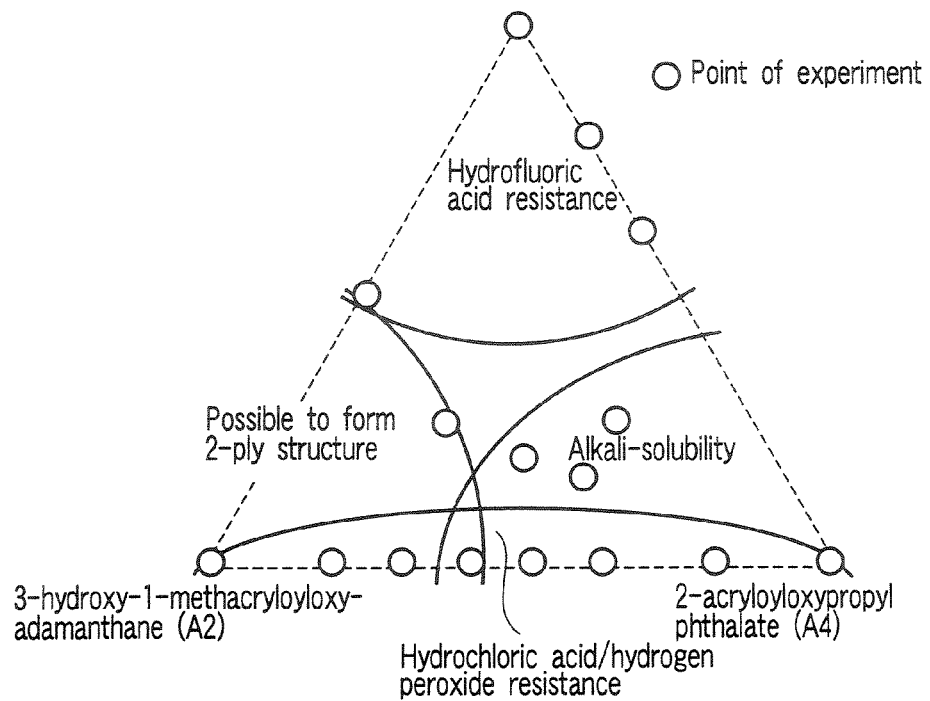
FIG. 2 is a diagram schematically illustrating the relationship between the composition of copolymer and a spec required for a protective film for frost treatment.

The relationships between the three-component system resins formed through the copolymerization of the monomers (A2), (A1) and (A4) and the properties desired to obtain are summarized in FIG. 2. As long as the resin is to be employed singly, it is impossible to obtain a composition meeting all of hydrofluoric acid resistance, hydrochloric acid/hydrogen peroxide resistance and alkali-solubility. Supposing that the resist film is formed into a 2-ply structure, if the resistance thereof to hydrofluoric acid is entrusted to the upper layer, thus separately entrusting the functions thereof to each of the layers, it will be recognized that a solution for obtaining desired properties may be found in a binary system comprising (A2) and (A4). In this case, it is required to select a resin which is capable of forming a 2-ply structure and also capable of exhibiting solubility to a resist solvent. Meanwhile, a resin having a composition satisfying the hydrochloric acid/hydrogen peroxide resistance and alkali-solubility is already known.

By constructing a resin film into a 2-ply structure with the aforementioned acrylic resin being employed as a lower layer and the novolac resin as an upper layer, it is possible to provide the resin film with resistance to the mixture of hydrochloric acid and hydrogen peroxide, hydrofluoric acid resistance and alkali-solubility. As for the novolac resin, it is possible to employ cresol novolac or phenol novolac. When these two kinds of novolac resin were respectively formed into a film having a thickness of 2 μm and measured with respect to the hydrofluoric acid resistance thereof, a film formed of phenol novolac was found more excellent in certain degree than a film formed of cresol novolac. Further, when meta-position novolac resin and para-position novolac resin were compared with each other, there was not found any substantial difference between them.

If it is tried to secure the alkali-solubility of the acrylic resin in a resin film of 2-ply structure, the resultant resin film would become high in hydrophilicity as a counteraction. As a result, there is much possibility that an acid is enabled to penetrate into the resin film. As a matter of fact, traces where an acid was more or less penetrated into the resin film were recognized. This problem however can be overcome by slightly enhancing the hydrophobicity of the lower layer.

For example, it was possible to incorporate naphthoquinone diazide (NQD5) as a low molecular compound for enhancing the hydrophobicity into the lower layer. This compound is generally employed as a photosensitive agent for a semiconductor resist and is provided, at 5-position thereof, with sulfonate. Since this NQD5 is incapable of exhibiting alkali-solubility unless it is exposed to light, it is assumed that the hydrophobicity of the resin can be enhanced by this NQD5, thereby effectively preventing an acid from penetrating into the resin layer. When this NQD5 is exposed to light through the irradiation of ultraviolet ray such as g-line of mercury lamp, this NQD5 is changed into indene carboxylic acid. As a result, the resultant compound is enabled to enhance the alkali-solubility, thereby making it possible to dissolve it in an alkaline developing solution. Depending on the exposure wavelength, it is also possible to obtain the same effects as described above even if naphthoquinone diazide provided, at 4-position thereof, with sulfonate is employed. Further, it is also possible to employ the following compounds as a compound which is capable of exhibiting almost the same effects as described above.

As for the examples of solubility-suppressing agent, they include acid-decomposable compounds which have a sufficient degree of solubility-suppressing capability against an alkaline solution and are capable of producing an acid-decomposed material which is capable of generating —O— in an alkaline solution.

Examples of the solubility-suppressing agent useful herein include isopropyl carbonyl ester, tetrahydropyranyl carbonyl ester, tetrahydrofuranyl carbonyl ester, methoxyethoxymethyl carbonyl ester, 2-trimethylsilylethoxymethyl carbonyl ester, t-butyl carbonyl ester, trimethylsilyl carbonyl ester, triethylsilyl carbonyl ester, t-butyldimethylsilyl carbonyl ester, isopropyldimethylsilyl carbonyl ester and di-t-butylmethylsilyl carbonyl ester of polycarboxylic acid of condensed polycyclic (alicyclic or aromatic) compound; oxazole; 2-alkyl-1,3-oxazoline; 4-alkyl-5-oxo-1,3-oxazoline; and 5-alkyl-4-oxo-1,3-dioxorane.

Further, it is also possible to employ the following compounds:

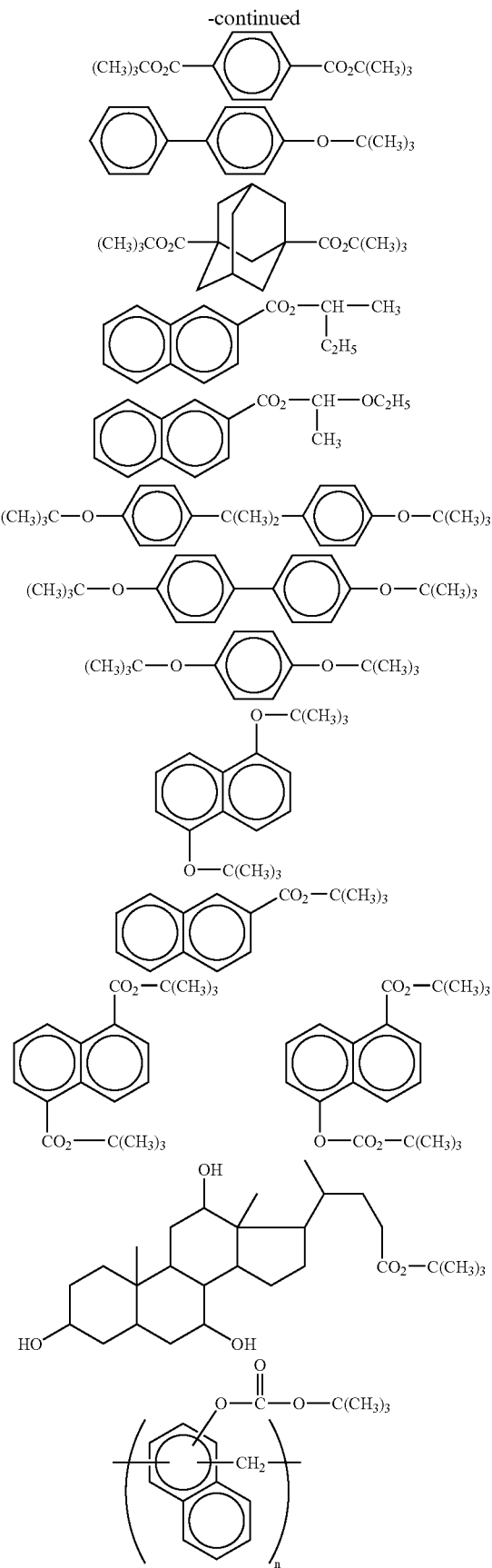

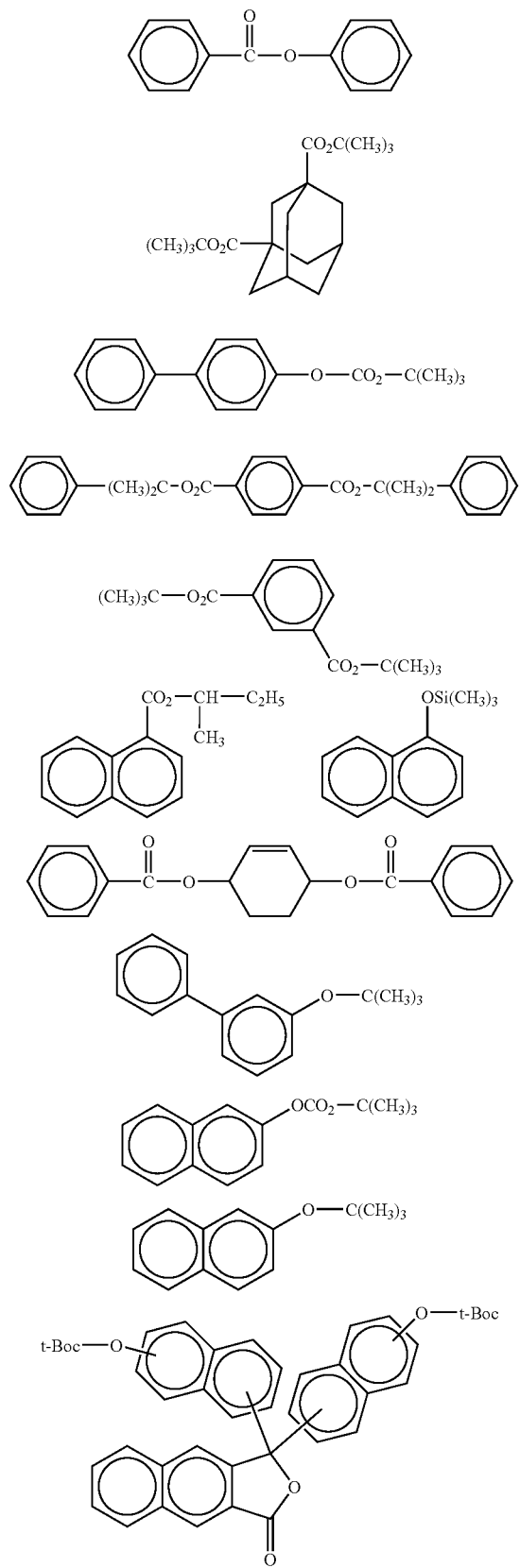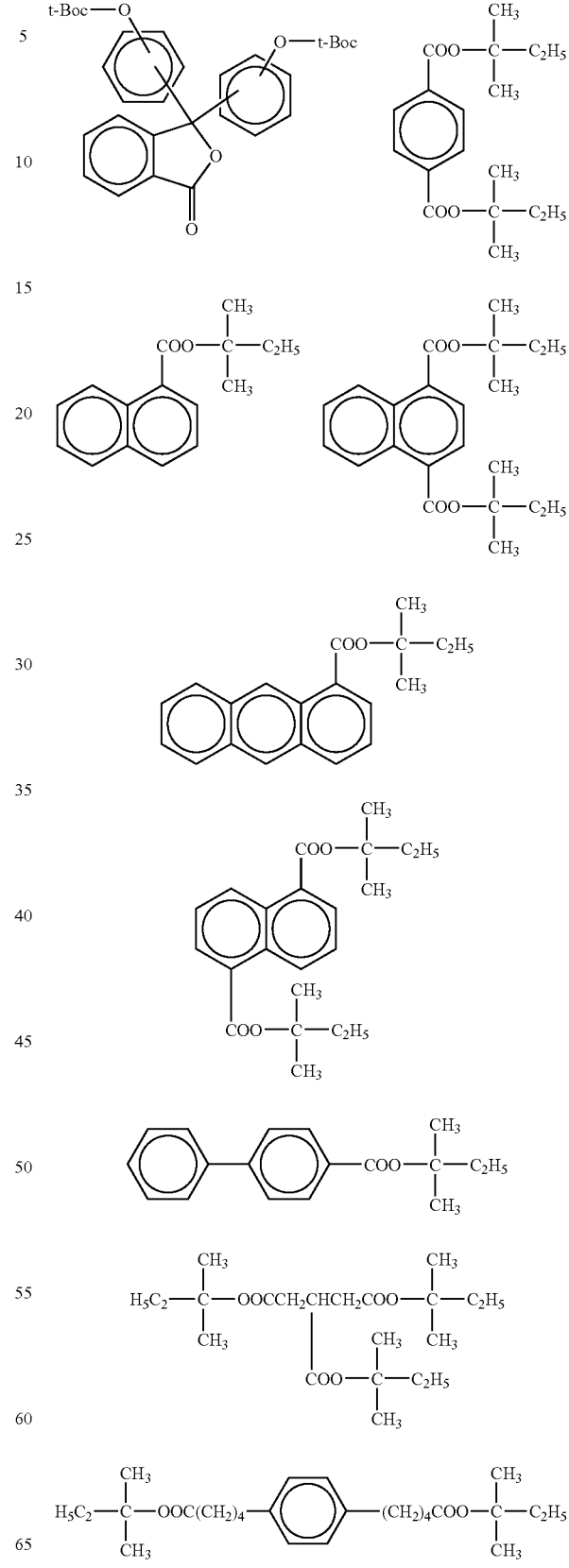

-continued

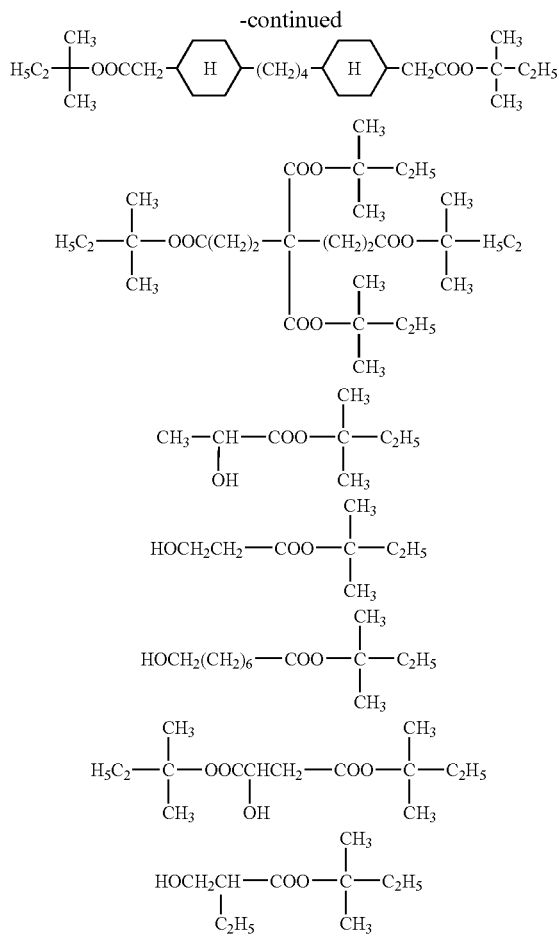

It was possible, through the addition of NQD5 to acrylic resin at a ratio of not less than 10% by weight, to enhance the hydrophobicity of the lower layer, thereby preventing an acid from penetrating into the lower layer. Moreover, the alkali-solubility of the acrylic resin was not obstructed at all by the addition of the NQD5. When the mixing ratio of the NQD5 was altered to 10% by weight, 20% by weight and 30% by weight, it was found that the degree of improvement of the acrylic resin could not be enhanced any more even if the mixing ratio of the NQD5 was increased over 20% by weight. Further, even if the mixing ratio of the NQD5 was increased up to 50% by weight, it was possible to spin-coat the acrylic acid solution. However, when the mixing ratio of the NQD5 was increased higher than 50% by weight, it was found impossible to coat the acrylic resin solution due to the decrease in content of the resin component. In view of these facts, it is assumed that a mixing ratio of not more than 20% by weight of the NQD5 would be enough for improving the acrylic resin.

It was found possible to substantially achieve the requirements to meet the specifications demanded in the frost treatment by using a laminate film comprising a lower layer which is composed of acrylic resin formed through the copolymerization of the monomers (A2) and (A4), and an upper layer which is composed of novolac resist. In order to find out a further optimized composition, various copolymers were synthesized by changing the mixing ratio of the monomer (A2) as shown in Table 6, below.

TABLE 6

| | Copolymers | | | | | |
|---|---|---|---|---|---|---|
| | C5 | C6 | C7 | C8 | C9 | C10 |
| Ratio of copolymer (A2) (mol %) | 30 | 40 | 50 | 60 | 70 | 80 |

After the NQD5 was added to each of the copolymers at a ratio of 5 to 20% by weight, the resultant mixtures were respectively dissolved in PGME. Each of the solutions thus obtained was coated on gallium phosphide substrate by spin coating method to form a lower resin layer. Then, novolac resist (S1818, Shiplay) was coated on the lower resin layer by spin coating method to form an upper resin layer having a thickness of 2 μm, thereby manufacturing samples each having a protective film.

The samples thus obtained were examined by subjecting them to a process which was expected to be performed in the frost treatment. In this process, the samples were immersed for 30 minutes in an aqueous solution of hydrochloric acid/hydrogen peroxide (hydrochloric acid: hydrogen peroxide: water=95:2:3 (based on volume)). Under this condition, several samples were drawn out and the protective films were removed by using an alkaline developing solution for semiconductor device (AD-10: a 2.38% aqueous solution of TMAH). When the substrates were observed by using a scanning electronic microscope, it was confirmed that the burr of the substrates was removed and the sidewalls of the substrates were neatly flattened. It was found out from the aforementioned results that the protective films created as described above were useful as a protective film for an etching solution comprising hydrochloric acid and hydrogen peroxide. It was also found out from the results of this experiment that if the mixing ratio between the monomer (A2) and the monomer (A4) was confined within the range of 20:80-80:20 in the preparation of a copolymer, it was possible to secure a sufficient resistance against an etching solution comprising hydrochloric acid and hydrogen peroxide by using only the copolymer without accompaniment of the novolac resist.

The residual samples which were not drawn out were immersed for 30 minutes in hydrofluoric acid (49%, room temperature) and then further immersed for 10 minutes in a neutralizing solution (aqueous solution of NH$_4$HCO$_3$). Subsequently, the cleavage surface of the samples was observed by cross-sectional SEM.

As a result, it was confirmed that in the cases of copolymers (C5) and (C6), the resin film formed on the substrate was fractured. The reason for this may be attributed to the fact that since the polymer employed as the lower layer was eroded by the acid and part of the lower layer was scooped out, resulting in the collapsing of the upper layer. Once the collapsing of the upper layer occurs, the acid enters into the inside of resin film. As a result, even a portion located inner than the designed dimension erode, thus defects generate in the substrate. Furthermore, the resin which was eluted out on the occasion of etching using hydrofluoric acid was permitted to readhere onto the gallium phosphide substrate, thus preventing the frost from neatly forming at an inner region located several micrometers as measured from the upper surface of the substrate.

In the cases of the copolymers (C7), (C8), (C9) and (C10), the phenomenon described above was not observed, thus the frost was formed neatly. On the upper surface of the substrate, there was left remained the resin which endured against the erosion to be effected by the acid during the etching process.

Since the gallium phosphide was eroded to an extent of 10 μm or so under the aforementioned condition, a portion of the substrate which was located immediately below the resin which was not eroded was turned into an eaves-like configuration.

Further, the resin layer of each of the samples was removed by using an alkaline developing solution (AD-10: Tama Chemicals co.: a 2.38% aqueous solution of TMAH) and the cleavage surface of the samples was observed by cross-sectional SEM.

In the cases of the copolymers (C5) and (C6), a portion which was close to the top surface thereof was etched insufficiently. Other samples were all etched uniformly. Incidentally, if hydrofluoric acid penetrates into the top surface of sample, defects called pit may generate. However, the generation of such a pit was not observed on the surface which was exposed by the peeling of the protective film in any of all samples, indicating that the penetration of hydrofluoric acid from the top surface of the protective film was prevented.

In order to secure a sufficient acid etching resistance of the resin, the copolymers comprising the components (A2) and (A4) according to one embodiment of the present invention were formulated such that the lower limit of the mixing ratio of the component (A2) was set to 40 mol % or more. As already explained above, in order to secure the alkali-solubility of the resin, the mixing ratio of the component (A4) is required to be 30 mol % or more. Namely, if the mixing ratio of the component (A2) is more than 70 mol %, it may become difficult to easily remove the resin by using an alkaline developing solution after the etching treatment thereof. When the alkali-solubility of the resin is taken into account, the mixing ratio of the component (A2) in the copolymer should preferably be 60 mol % or less.

Furthermore, the weight average molecular weight (Mw) of resin is also an important condition influencing the alkali-solubility of resin. If this Mw is less than ten thousands, the resin dissolves in hydrofluoric acid, thereby making it difficult to generate frosting in the gallium phosphide substrate. On the other hand, if this Mw is higher than thirty thousands, it may become difficult to remove the resin layer by using an alkaline developing solution. As far as the alkali-solubility is concerned, the increase of Mw of the copolymer acts in the same manner as the mixing ratio of the component (A2). With respect to the influence of Mw on the hydrofluoric acid resistance however, the hydrofluoric acid resistance of the copolymer tends to be influenced in somewhat different manner.

By taking the aforementioned results into account, the resin layer was formed into a 2-ply structure wherein the upper layer is provided with corrosion resistance to hydrofluoric acid and the lower layer is provided with resistance to the penetration of hydrofluoric acid, thus separately entrusting the functions thereof to these layers. By doing so, it was possible to meet the specifications required for the frost treatment of the resin layer.

The resin layer having such a 2-ply structure was capable of withstanding the corrosion in an aqueous solution of hydrochloric acid/hydrogen peroxide for 60 minutes and in a hydrofluoric acid for 60 minutes, and was also capable of dissolving in an alkaline developing solution (a 2.38% aqueous solution of TMAH) within about one minute.

Next, the present invention will be further explained in detail with reference to specific embodiments.

Figure 3:
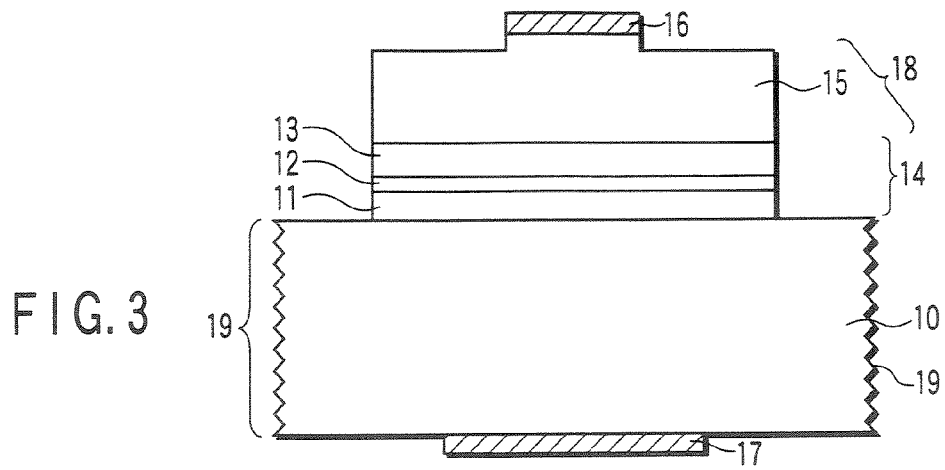
FIG. 3 is a cross-sectional view of a light emitting element which was manufactured by the method according to one embodiment of the present invention.

FIG. 3 shows a cross-sectional view of a light emitting element which was manufactured by the method according to one embodiment of the present invention. As shown in FIG. 3, on a compound semiconductor substrate 10 having an electrode 17 on the bottom surface thereof, there are formed a light emitting layer 14 and a current diffusion layer 15, which are successively deposited thereon by epitaxial growth. On the current diffusion layer 15, there is additionally formed a wiring electrode pattern 16. These light emitting layer 14 and current diffusion layer 15 will be hereinafter referred to integrally as an epitaxial layer 18.

As for the compound semiconductor substrate 10, it is possible to employ n-GaAs or n-GaP. The light emitting layer 14 comprises a lower clad layer 11 made of n-InAlP, on which an active layer 12 made of InGaAlP and an upper clad layer 13 made of p-InAlP are deposited to form a hetero-structure. The current diffusion layer 15 may be formed using p-GaP for instance.

In this embodiment, although an n-type substrate is shown as an example, it is also possible to employ a p-type substrate. If a p-type substrate is to be employed, the conductivity type of each of the layers should be simply reversed.

Since the light emitting element was manufactured by the method according to the embodiment of the present invention, it was possible to form a rugged surface 19 by frost treatment on the sidewall of the compound semiconductor substrate 10.

Figure 4:
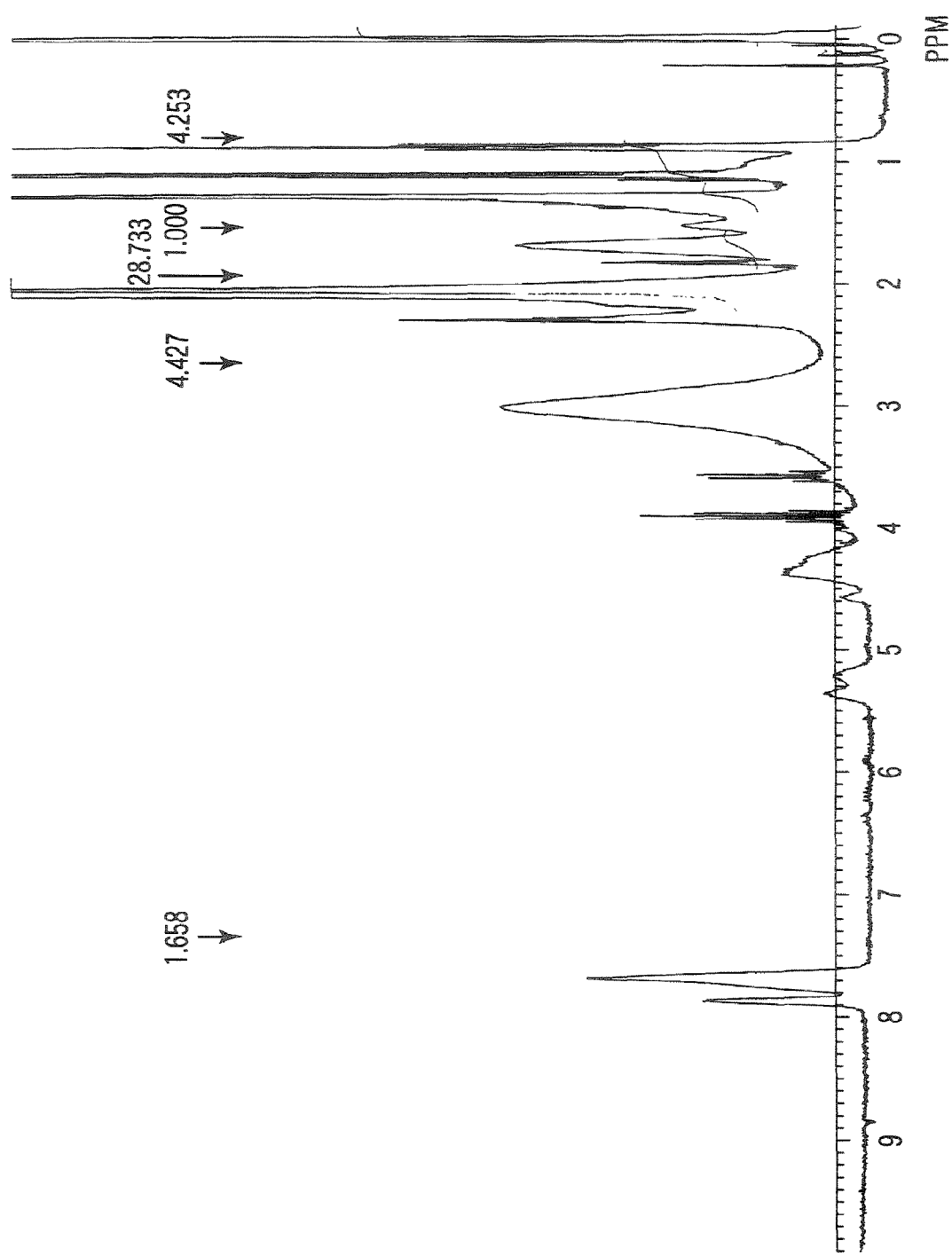
FIG. 4 is an NMR chart of an acid etching resistance material according to one embodiment of the present invention.

Specifically, the light emitting element shown in FIG. 3 was manufactured according to the following method by using an acid etching resistance material according to one embodiment of the present invention. Namely, the material employed herein was formed of a copolymer comprising 60 mol % of the aforementioned monomer (A2) and 40 mol % of the aforementioned monomer (A4). The NMR chart of this copolymer is shown in FIG. 4. Naphthoquinone diazide was incorporated in this copolymer at a ratio of 10% by weight and then dissolved in PGME to prepare a solution for forming a protecting film.

Next, the method of manufacturing a semiconductor device according to one embodiment of the present invention will be explained with reference to FIGS. 5 to 12.

Figure 5:
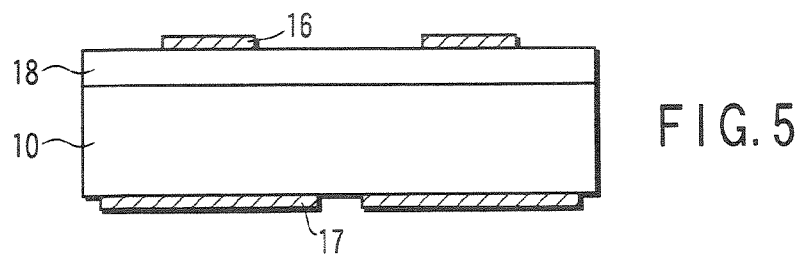
FIG. 5 is a cross-sectional view illustrating the step of the manufacturing method of a semiconductor device according to one embodiment of the present invention.
Figure 6:
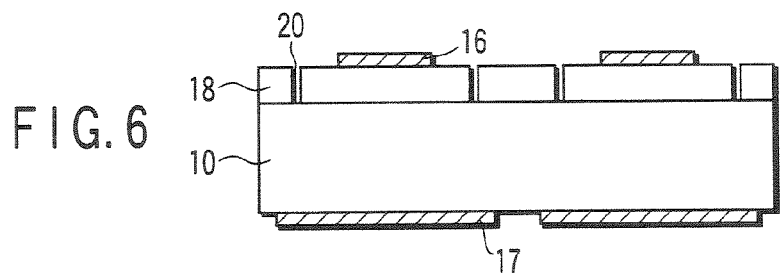
FIG. 6 is a cross-sectional view illustrating a step to be executed following the step shown in FIG. 5.

First of all, as shown in FIG. 5, on the surface of a compound semiconductor substrate 10 having electrodes 17 on the bottom surface thereof, there were formed an epitaxial layer 18 and electrodes 16. Although not shown in FIG. 5, the epitaxial layer 18 was constituted by the light emitting layer 14 consisted of the lower clad layer 11, the active layer 12 and the upper clad layer 13, and by the current diffusion layer 15 as explained with reference to FIG. 3. In this epitaxial layer 18, grooves 20 were formed in such a manner that the grooves 20 were located on the outer circumference of the electrodes as shown in FIG. 6.

Figure 7:
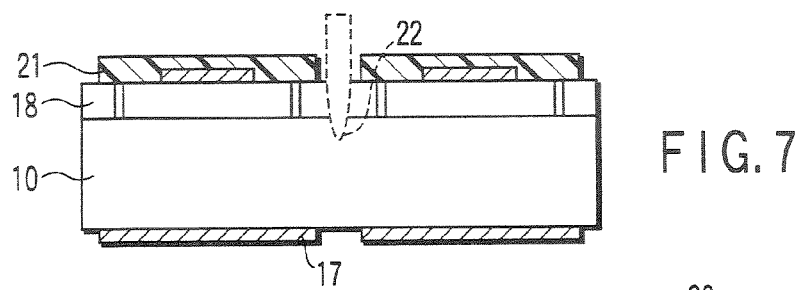
FIG. 7 is a cross-sectional view illustrating a step to be executed following the step shown in FIG. 6.

Then, as shown in FIG. 7, a protecting film 21 was formed on the epitaxial layer 18 so as to cover the electrodes 16. The formation of the protecting film 21 was performed as follows. First of all, the aforementioned solution for forming the protecting film was coated on the epitaxial layer 18 by spin coating method and the resultant film was pre-baked for 90 seconds at a temperature of 120° C. to remove the solvent, thereby forming a lower resin layer having a thickness of 0.3 μm. On this lower resin layer, novolac resist (S1818, Shiplay) was further coated and pre-baked for 90 seconds at a temperature of 110° C. to vaporize the solvent, thereby forming an upper resin layer having a thickness of 2.5 μm. As a result, a resin layer of 2-ply structure was formed, thus enabling it to be used as a protecting film 21 for an acid.

Figure 8:
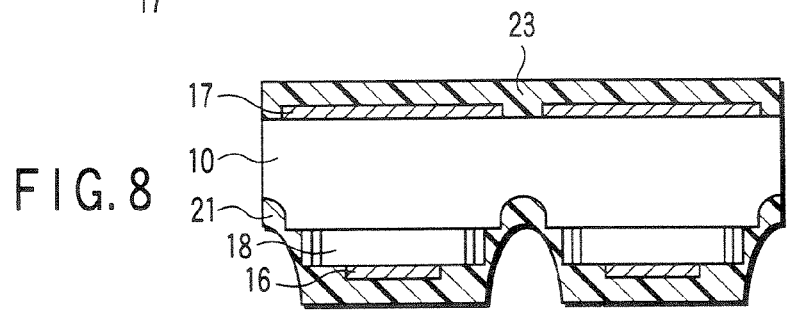
FIG. 8 is a cross-sectional view illustrating a step to be executed following the step shown in FIG. 7.
Figure 9:
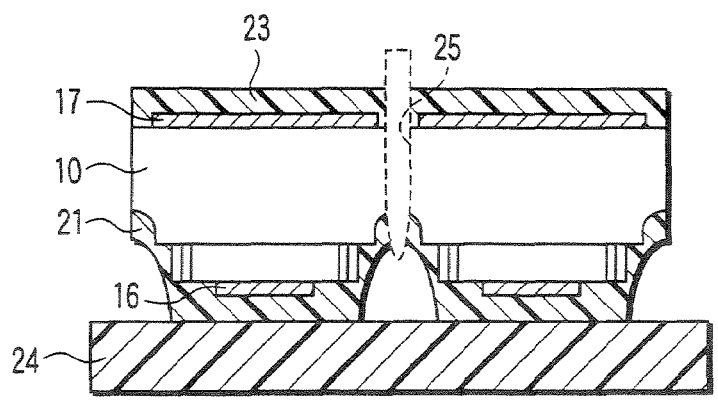
FIG. 9 is a cross-sectional view illustrating a step to be executed following the step shown in FIG. 8.
Figure 10:
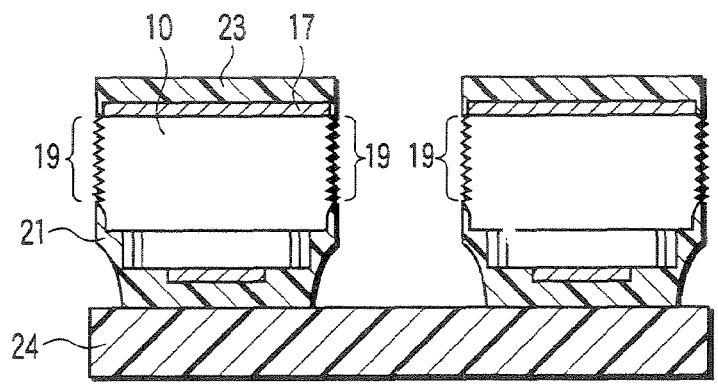
FIG. 10 is a cross-sectional view illustrating a step to be executed following the step shown in FIG. 9.

After finishing the formation of the protecting film 21, the substrate 10 was subjected to dicing treatment to form a cut line 22 penetrating into a midway in thickness of the substrate 10 as shown in FIG. 7. Then, the substrate 10 was turned upside down and a protecting film 23 was formed on the rear side of the substrate 10 in the same manner as described above, thereby covering the electrodes 17 as shown in FIG. 8. Subsequently, as shown in FIG. 9, the protecting film 21 was adhered onto an expand sheet 24 and the substrate 10 was subjected to dicing treatment from the protecting film 23 side to form a cut line 25. Subsequently, the expand sheet 24 was stretched to separate the substrate 10 into individual chips.

Figure 11:
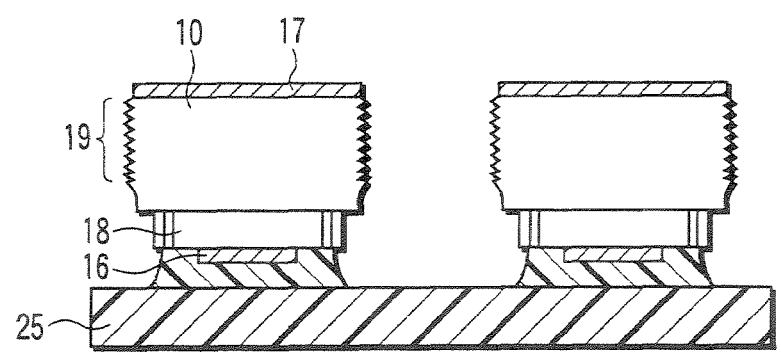
FIG. 11 is a cross-sectional view illustrating a step to be executed following the step shown in FIG. 10.

These chips were then immersed in a mixed solution containing hydrochloric acid and hydrogen peroxide to remove fractured layers. Subsequently, these chips were immersed in 49% concentrated hydrofluoric acid to perform the frost treatment thereof. As a result, a rugged surface 19 was formed on the sidewalls of the chips as shown FIG. 10. After being neutralized using a hydrofluoric acid-neutralizing liquid, the chips were treated with an aqueous solution of TMAH to dissolve and remove the protecting film 23, thereby enabling the electrodes 17 to expose as shown in FIG. 11. On this occasion, part of the protecting film 21 was also removed.

Figure 12:
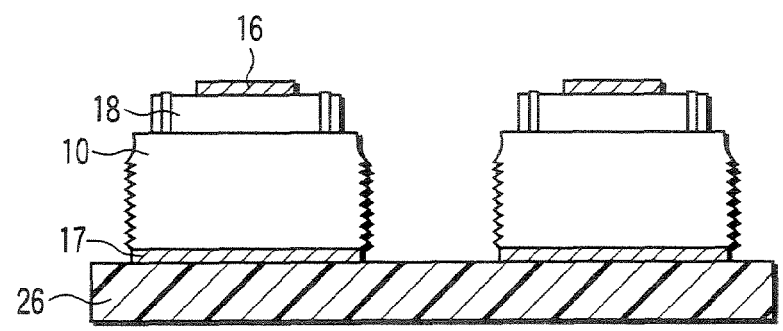
FIG. 12 is a cross-sectional view illustrating a step to be executed following the step shown in FIG. 11.

Finally, the electrodes 17 were adhered onto the resin sheet 26 to remove the residual portion of the protecting film 21 to obtain a structure as shown in FIG. 12. Then, the chips were individually taken off from the resin sheet 26 to accomplish the manufacture of a light emitting element (light emitting diode) having, on the sidewalls of substrate, the rugged surface as shown in FIG. 3.

On the other hand, by following the same process as explained above except that the aforementioned rugged surface was not formed on the sidewalls of substrate, light emitting diodes according to the prior art were manufactured and compared, with respect to the luminance, with the light emitting diodes prepared as described above according to one embodiment of the present invention. As a result, the luminance of the light emitting diode provided with the rugged surface was found enhanced by 40% in average of ten pieces as compared with the light emitting diode of the prior art.

Further, by following the same process as explained above except that only the conventional novolac resist (S1818) was employed as a protecting film, light emitting diodes were manufactured.

As a result, hydrofluoric acid penetrates into the protecting film on the occasion of hydrofluoric acid treatment, resulting in the erosion of the light emitting layer by the effect of the hydrofluoric acid.

As a result, the percent defective was as high as 30% or more.

Whereas, in the case of the light emitting elements manufactured by the method according to one embodiment of the present invention, the percent effective was as very low as 0.1% or less. In addition o the prominent decrease of the percent defective, it was confirmed through the observation of the optical microscopic images as well as through the observation of the SEM images that as compared with the conventional light emitting elements, the light emitting elements manufactured by the method according to one embodiment of the present invention were also improved in configuration as acceptable products.

According to one embodiment of the present invention, there is also provided an acid etching resistance material which is adapted to be employed in a frost treatment for enhancing the light extracting efficiency of light emitting element, and is capable of exhibiting sufficient acid resistance and excellent alkali-solubility. Further, according to another embodiment of the present invention, there is also provided a method of manufacturing a semiconductor device where the aforementioned acid etching resistance material is employed. Furthermore, according to a further embodiment of the present invention, there is also provided a novel copolymer.

EMBODIMENT 2

Next, the features of this embodiment will be explained with reference to the attached drawings.

Incidentally, the components which are common throughout the embodiments will be identified by the attaching the same reference symbols, thereby omitting the overlapped explanation thereof. Further, each of the drawings is a schematic view only for the purpose of explanation and understanding of the invention, so that the configuration, size and proportion thereof may differ depending on the location thereof from the actual apparatus. However, they may be optionally modified in design by referring to the following explanations as well as to the known techniques.

The acid etching resistance material according to this embodiment should be a photosentive hydrofluoric acid etching material having photosensitivity. By the term "photosentive hydrofluoric acid etching material", it is intended to mean a material which is applicable to hydrofluoric acid etching and is provided with photosensitivity. This photosentive hydrofluoric acid etching material is characterized in that it comprises a resin, and a photoacid generating agent which is capable of generating acid as it is exposed to light. Next, these resin and photoacid generating agent as well as other compounds will be explained in detail.

1) Resin:

The resin according to this embodiment is featured to have at least two kinds of repeating units (hereinafter, referred to as segments) which can be represented by the following general formula (PS1). For the convenience of explanation, the resin will be explained segment by segment, i.e., a first segment comprising a main chain and $R^{12}$, and a second segment comprising a main chain and $R^{14}$. Incidentally, the first segment and the second segment are incorporated at random in the main chain.

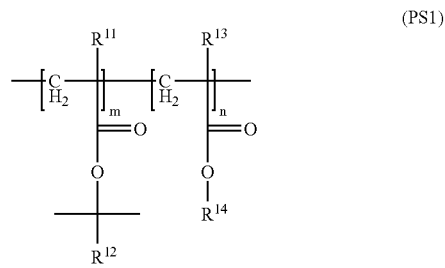

(PS1)

(in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone groups; and m and n represent individually a natural number).

The main chain is either acrylate where $R^{11}$ and $R^{13}$ are both constituted by a hydrogen atom, or methacrylate where $R^{11}$ and $R^{13}$ are both constituted by methyl group. The acrylic resin provided with these acrylic backbones is more excellent in hydrofluoric acid resistance as compared with a resin having other kinds of main chain.

In viewpoint of improving the resolution on the occasion of optical patterning, it is more preferable to employ acrylate where $R^{11}$ and $R^{13}$ are both constituted by hydrogen atom.

The first segment comprises tertiary carbon atom, and an alicyclic group $R^{12}$ which is linked via this tertiary carbon atom to the main chain and provided with a substituent group to be discussed hereinafter. This first segment is a solubility-suppressing group (inhibitor group, protecting group) against an alkaline developing solution and is capable of improving the resolution.

Due to the fact that tertiary carbon atom is interposed between the alicyclic group and the main chain, this first segment can be dissociated and decomposed to generate carboxylic acid under a heated condition where a strong acid is employed as a catalyst. Due to the decomposition reaction of side chain of this first segment, the resin according to this embodiment is enabled to dissolve in an alkaline developing solution. Due to this characteristic, the resin according to this embodiment can be employed as a photosensitive hydrofluoric acid etching resist material. Incidentally, the acid to be employed as a catalyst can be generated by exposing the photoacid generating agent to light.

The alicyclic group constituting $R^{12}$ may be selected from the group consisting of adamantane, tricyclodecane, norbornane, isobornane, cyclohexane and cyclooctane. Since these alicyclic groups are bulky, they are capable of protecting the main chain from hydrofluoric acid, thereby enhancing hydrofluoric acid corrosion/decomposition resistance. Incidentally, since adamantane, tricyclodecane, norbornane and isobornane are formed of a crosslinking structure and hence rigid, the hydrofluoric acid corrosion/decomposition resistance of the resin can be further enhanced.

In viewpoint of enhancing the hydrofluoric acid corrosion/decomposition resistance, the employment of adamantane which is most rigid and formed of a chemically stable structure is more preferable.

The substituent group attached to the $R^{12}$ is provided with one or two hydroxyl groups. Hydroxyl group is excellent in adhesion to a substrate, thus enhancing the hydrofluoric acid penetrating resistance. Incidentally, if there are three or more hydroxyl groups in the substituent group, the hydrophilicity of resin is further enhanced to extremely increasing the solubility of resin to alkaline developing solution. As a result, the formation of pattern would become difficult in the optical patterning step, greatly deteriorating the resolution on the occasion of optical patterning. Therefore, the inclusion of three or more hydroxyl groups in the substituent group is not preferable.

When the balance between the solubility to the alkaline developing solution and the adhesion to substrate is taken into account, the inclusion of only one hydroxyl group in the substituent group is most preferable.

The second segment is composed of an alicyclic group $R^{14}$ which is provided with a substituent group to be discussed hereinafter. This second segment is capable of enhancing the hydrofluoric acid resistance of resin.

The alicyclic group constituting $R^{14}$ has characteristics which are similar to those of $R^{12}$. Further, when $R^{14}$ is constituted by a group which is similar to that of $R^{12}$, the polymerization of the resin would become easier, thus making it more preferable.

The substituent group attached to the $R^{14}$ is provided with one ketone group. As compared with hydroxyl group, the ketone group is more excellent in adhesion to a substrate, thus enhancing the hydrofluoric acid penetrating resistance. Incidentally, if there are two or more ketone groups in the substituent group, the polymerization of monomers to be employed as raw materials of the resin would become more difficult. Therefore, the inclusion of two or more ketone groups in the substituent group is not preferable.

Incidentally, the employment, for example, of carboxylic acid group as a substituent group is not suitable due to the facts that it is low in hydrofluoric acid resistance, that it is high in polarity and hence poor in solubility to ordinary resist solvents, and that it is excessively high in hydrophilicity, hence greatly deteriorating the resolution on the occasion of optical patterning. Further, the employment of lactone group as a substituent group is not suitable due to the facts that when lactone group is reacted with an acid or alkali, lactone group splits to generate carboxylic acid, thereby deteriorating the hydrofluoric acid resistance.

With respect to the ratio between the first segment and the second segment, the ratio of m:n should preferably be confined within the range of 30:70 to 70:30. As long as the ratio of m:n is confined within this range, the functions of each of these segments would be effectively exhibited. Namely, if m is 30 or more, the resolution would be enhanced on the occasion of optical patterning, and if n is 30 or more, the hydrofluoric acid resistance would be enhanced.

Incidentally, when the solubility of resin on the occasion of developing step is taken into consideration, the upper limit of molecular weight of the resin would be about 100,000, more preferably about 40,000 to 50,000 in order to retain the resolution of the order of microns.

As explained above, since the resin according to this embodiment is provided with excellent hydrofluoric acid resistance and excellent photosensitivity, the resin can be employed as a photosensitive hydrofluoric acid etching resist material.

Further, since the resin according to this embodiment is composed of at least two kinds of segments, it is preferable in the respects that the polymerization thereof would be facilitated, and that the selection of alicyclic groups as well as composition ratio can be easily optimized depending on the applications of the resin.

Furthermore, since the resin according to this embodiment does not include therein a double bond of carbon-carbon, there will be no light absorption by π-electron cloud, so that the resin is excellent in transparency in all of the ultraviolet, visible and infrared regions, i.e. in the wavelength region ranging from around 190 nm to around 1 μm. Therefore, the resin according to this embodiment can be employed, as it is, as an optical component of photochemical semiconductor devices such as an optical waveguide, etc.

Figure 13:
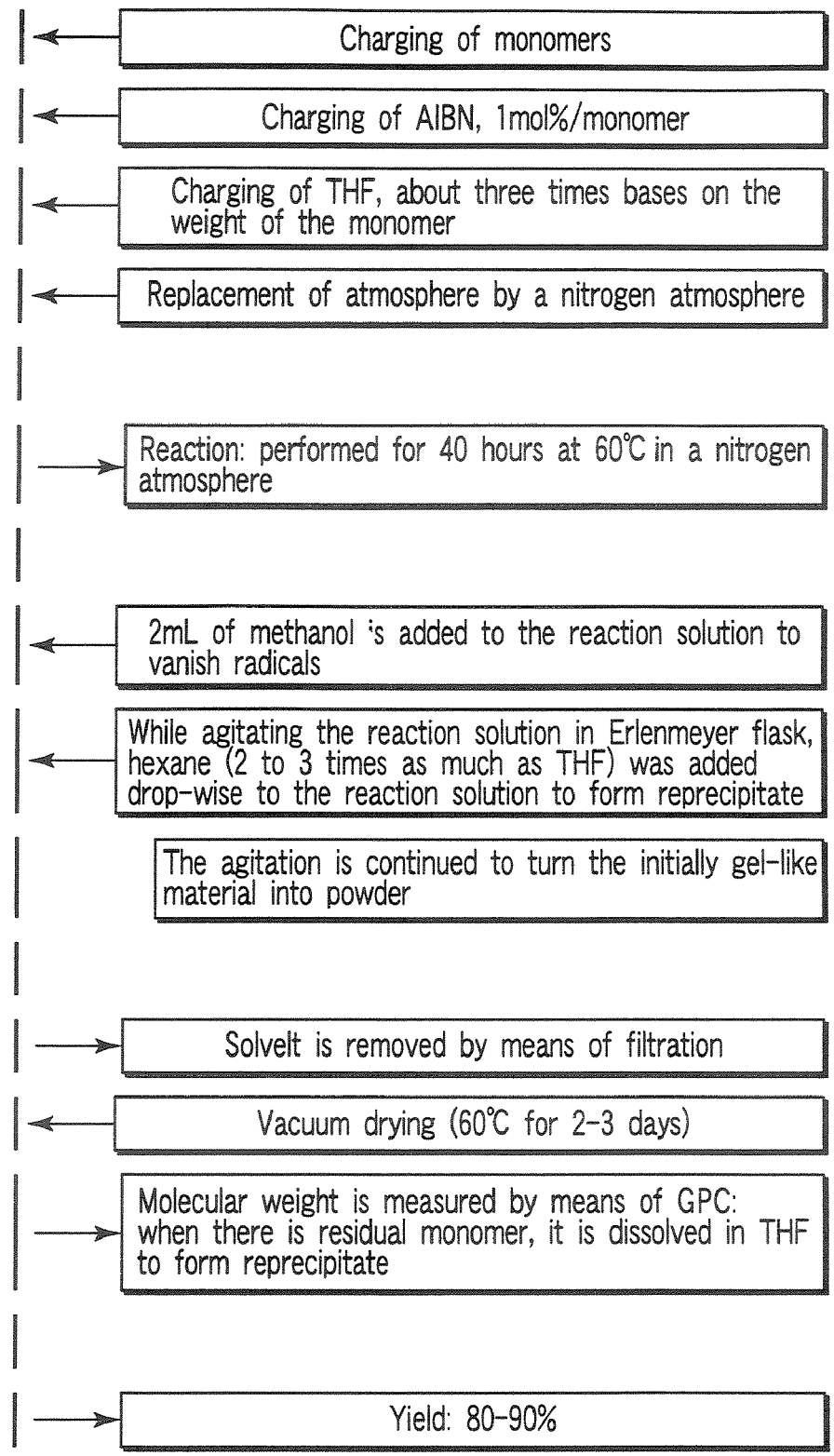
FIG. 13 is a flowchart illustrating a method of synthesizing a resin according to another embodiment of the present invention.

The resin according to this embodiment can be synthesized according to the flowchart shown in FIG. 13 for instance.

2) Photoacid Generating Agent:

Photoacid generating agent (PAG) may be selected from any kinds of compounds as long as they are capable of generating an acid as they are exposed to light.

For example, it is possible to employ aryl onium salts, naphthoquinone diazide compounds, diazonium salts, sulfonate compounds, sulfonium compounds, sulfamide compounds, iodonium compounds, sulfonyl diazomethane compounds, etc.

Specific examples of the aforementioned compounds include triphenylsulfonium triflate, diphenyliodonium triflate, 2,3,4,4-tetrahydroxybenzophenone-4-naphthoquinone diazide sulfonate, 4-N-phenyl amino-2-methoxyphenyl diazonium sulfate, 4-N-phenylamino-2-methoxyphenyldiazonium-p-ethylphenyl sulfate, 4-N-phenylamino-2-methoxyphenyldiazonium-2-naphthyl sulfate, 4-N-phenylamino-2-methoxyphenyldiazoniumphenyl sulfate, 2,5-diethoxy-4-N-4'-methoxyphenylcarbonylphenyldiazonium-3-carboxy-4-hydroxyphenyl sulfate, 2-methoxy-4-N-phenylphenyldiazonium-3-carboxy-4-hydroxyphenyl sulfate, diphenylsulfonyl methane, diphenylsulfonyl diazomethane, diphenyl disulfone, α-methylbenzoin tosylate, pyrogallo trimesylate, benzoin tosylate, MPI-103 (CAS. NO. [87709-41-9]; Midori Kagaku Co., Ltd.), BDS-105 (CAS. NO. [145612-66-4]; Midori Kagaku Co., Ltd.), NDS-103 (CAS. NO. [110098-97-0]; Midori Kagaku Co., Ltd.), MDS-203 (CAS. NO. [127855-15-5]; Midori Kagaku Co., Ltd.), Pyrogallo tritosylate (CAS. NO. [20032-64-8]; Midori Kagaku Co., Ltd.), DTS-102 (CAS. NO. [75482-18-7]; Midori Kagaku Co., Ltd.), DTS-103 (CAS. NO. [71449-78-0]; Midori Kagaku Co., Ltd.), MDS-103 (CAS. NO. [127279-74-7]; Midori Kagaku Co., Ltd.), MDS-105 (CAS. NO. [116808-67-4]; Midori Kagaku Co., Ltd.), MDS-205 (CAS. NO. [81416-37-7]; Midori Kagaku Co., Ltd.), BMS-105 (CAS. NO. [149934-68-9]; Midori Kagaku Co., Ltd.), TMS-105 (CAS. NO. [127820-38-6]; Midori Kagaku Co., Ltd.), NB-101 (CAS. NO. [20444-09-1]; Midori Kagaku Co., Ltd.), NB-201 (CAS. NO. [4450-68-4]; Midori Kagaku Co., Ltd.), DNB-101 (CAS. NO. [114719-51-6]; Midori Kagaku Co., Ltd.), DNB-102 (CAS. NO. [131509-55-2]; Midori Kagaku Co., Ltd.), DNB-103 (CAS. NO. [132898-35-2]; Midori Kagaku Co., Ltd.), DNB-104 (CAS. NO. [132898-36-3]; Midori Kagaku Co., Ltd.), DNB-105 (CAS. NO. [132898-37-4]; Midori Kagaku Co., Ltd.), DAM-101 (CAS. NO. [1886-74-4]; Midori Kagaku Co., Ltd.), DAM-102 (CAS. NO. [28343-24-0]; Midori Kagaku Co., Ltd.), DAM-103 (CAS. NO. [14159-45-6]; Midori Kagaku Co., Ltd.), DAM-104 (CAS. NO. [130290-80-1] and CAS. NO. [130290-82-3]; Midori Kagaku Co., Ltd.), DAM-201 (CAS. NO. [28322-50-1]; Midori Kagaku Co., Ltd.), CMS-105 (Midori Kagaku Co., Ltd.), DAM-301 (CAS. NO. [138529-81-4]; Midori Kagaku Co., Ltd.), SI-105 (CAS. NO. [34694-40-7]; Midori Kagaku Co., Ltd.), NDI-105 (CAS. NO. [133710-62-0]; Midori Kagaku Co., Ltd.); and EPI-105 (CAS. NO. [135133-12-9]; Midori Kagaku Co., Ltd.).

Further, as the photoacid generating agent, the following compounds can be also employed.

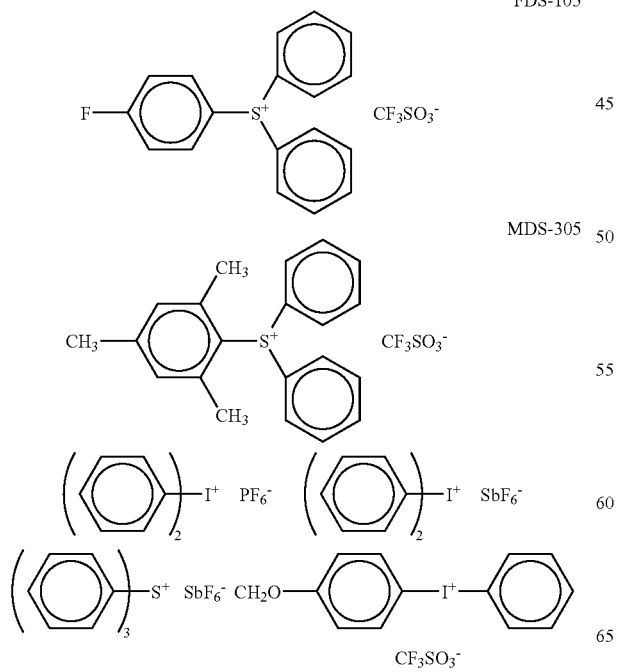

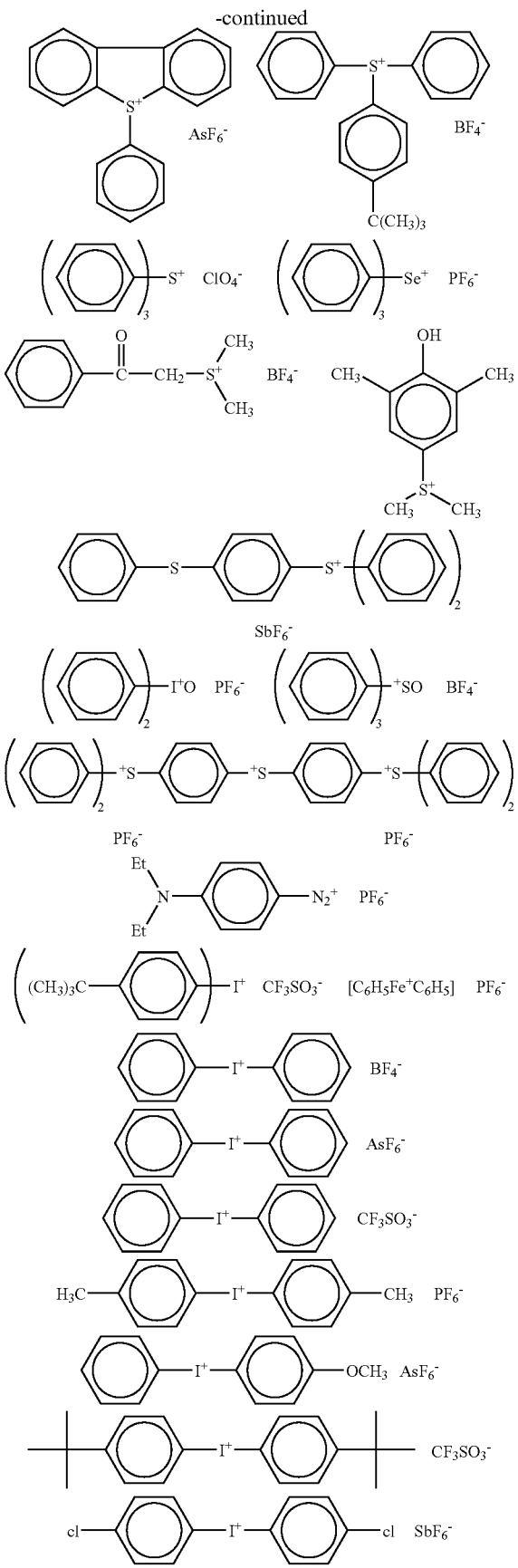

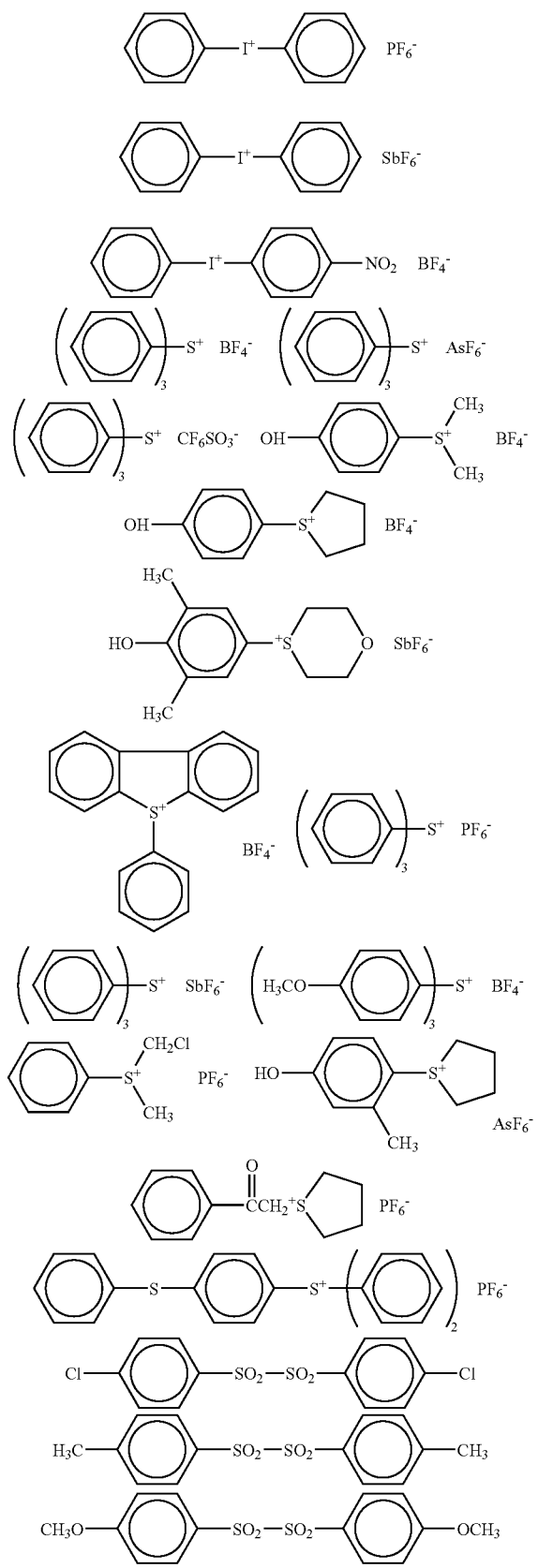
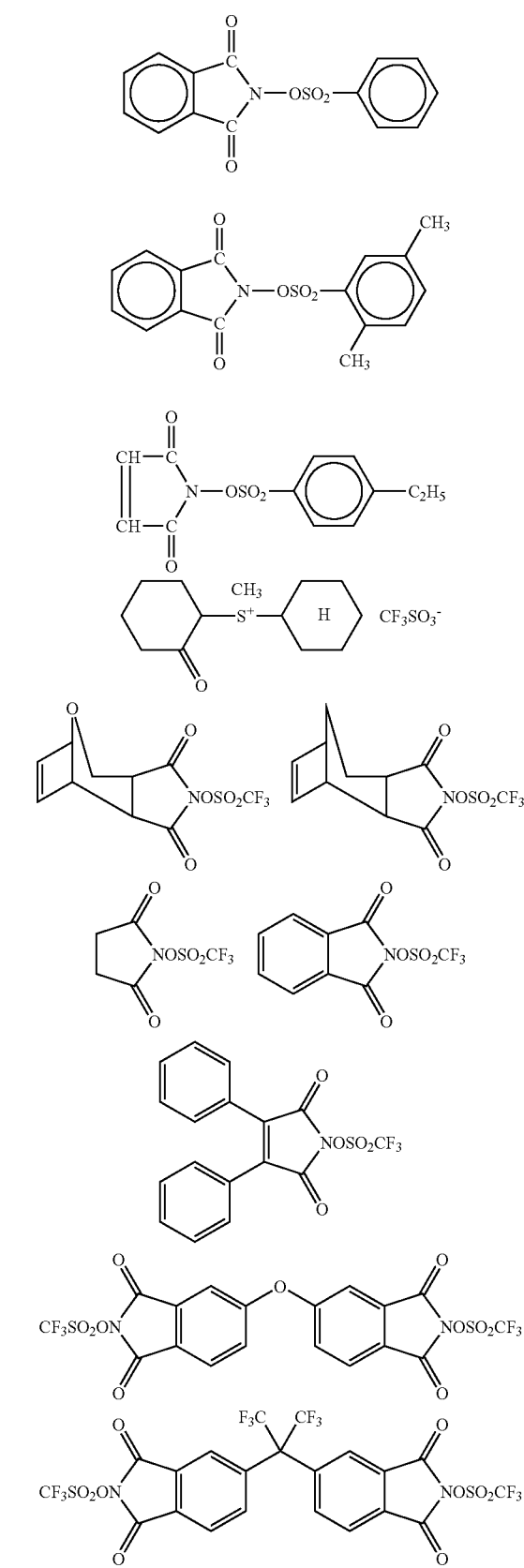

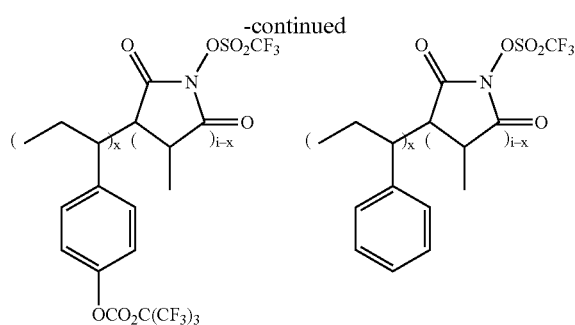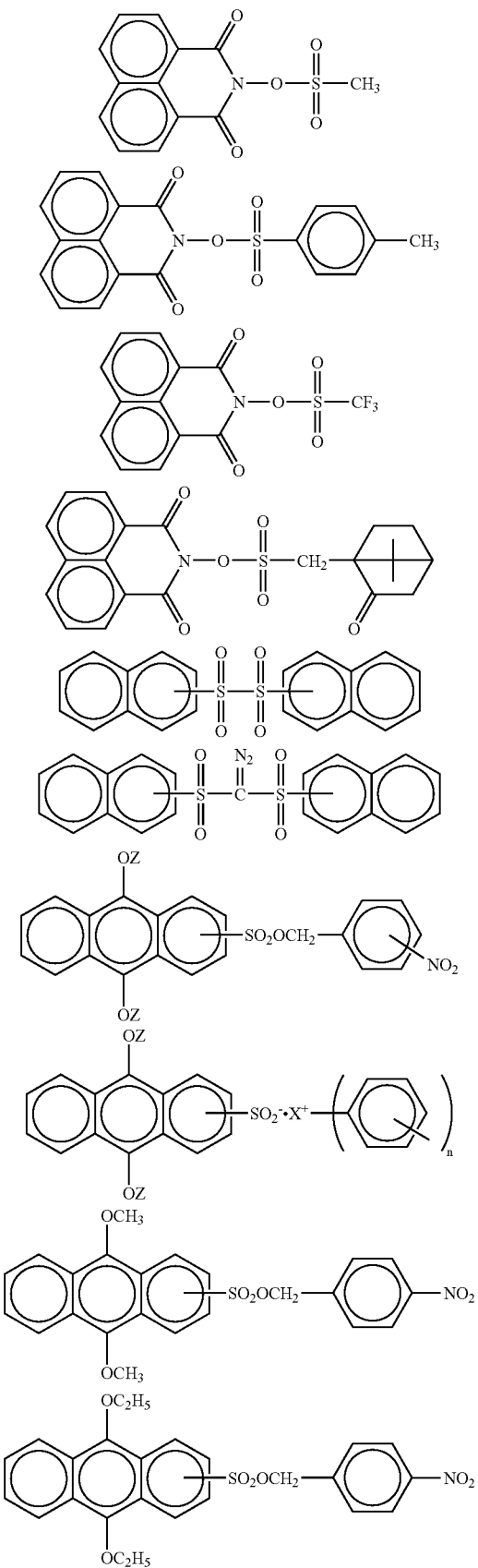
wherein $X^-$ is $CF_3SO_3^-$, $BF_4^-$, $AsF_6^-$, $PF_6^-$ or $SbF_6^-$.

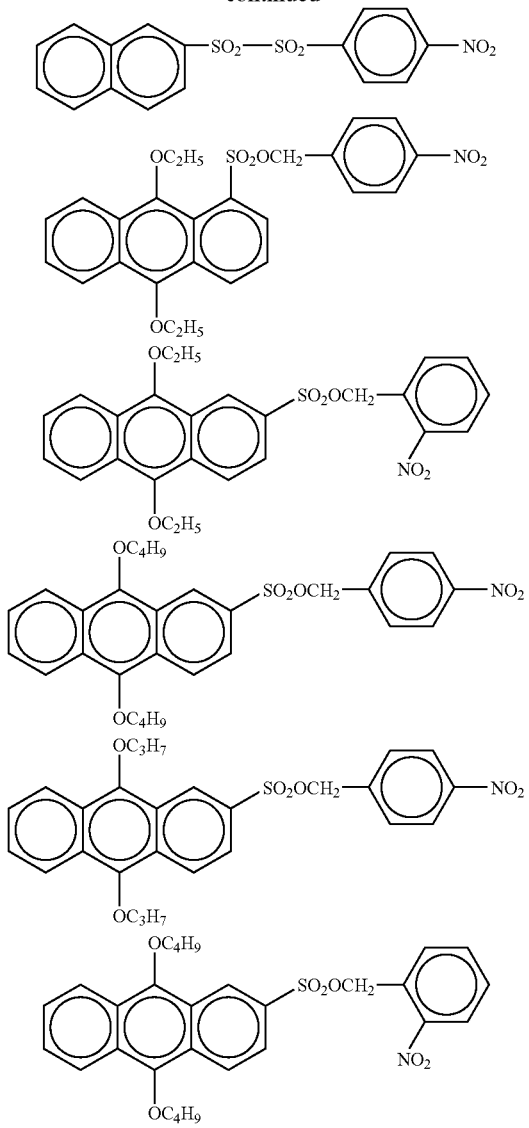

wherein Z is alkyl group.

Among these photoacid generating agents, preferable examples thereof are triphenylsulfonium triflate, diphenyliodonium triflate, trinaphthylsulfonium triflate, dinaphthyliodonium triflate, dinaphthylsulfonyl methane, NAT-105 (CAS. NO. [137867-61-9]; Midori Kagaku Co., Ltd.), NAT-103 (CAS. NO. [131582-00-8]; Midori Kagaku Co., Ltd.), NAI-105 (CAS. NO. [85342-62-7]; Midori Kagaku Co., Ltd.), TAZ-106 (CAS. NO. [69432-40-2]; Midori Kagaku Co., Ltd.), NDS-105(Midori Kagaku Co., Ltd.), PI-105(CAS. NO. [41580-58-9]; Midori Kagaku Co., Ltd.), s-alkylated dibenzothiophene triflate, and s-fluoroalkylated dibenzothiophene triflate (Daikin Co., Ltd.). Among these photoacid generating agents, especially preferable examples thereof are triphenylsulfonium triflate, trinaphthylsulfonium triflate, dinaphthyliodonium triflate, dinaphthylsulfonyl methane, NAT-105 (CAS. NO. [137867-61-9]; Midori Kagaku Co., Ltd.), NDI-105 (CAS. NO. [133710-62-0]; Midori Kagaku Co., Ltd.), and NAI-105 (CAS. NO. [85342-62-7]; Midori Kagaku Co., Ltd.).

In this embodiment, a preferable mixing ratio of the photoacid generating agent is confined within the range of 0.001 to 50 mol %, more preferably 0.01 to 40 mol %, most preferably 0.1 to 20 mol % based on a total quantity of solid matters. Namely, if the mixing ratio of the photoacid generating agent is less than 0.001 mol %, it would be difficult to form a pattern with high resolution. On the other hand, if the mixing ratio of the photoacid generating agent is more than 50 mol %, the film to be formed would be deteriorated in mechanical strength thereof.

3) Others:

The photosensitive hydrofluoric acid etching resist materials according to this embodiment can be prepared as varnish by dissolving these compounds in an organic solvent and filtering the resultant solution.

As for the organic solvent, it is possible to employ ketone-based solvents such as cyclohexanone, acetone, methylethyl ketone, methylisobutyl ketone, etc.; cellosolve-based solvents such as methyl cellosolve, methyl cellosolve acetate, ethyl cellosolve acetate, butyl cellosolve acetate, etc.; ester-based solvents such as ethyl acetate, butyl acetate, isoamyl acetate, γ-butyrolactone, etc.; glycol-based solvents such as propylene glycol monomethyl ether acetate, etc.; nitrogen-containing solvents such as dimethylsulfoxide, hexamethyl phosphoric triamide dimethylformamide, N-methylpyrrolidone, etc.; and mixed solvents comprising any one of the aforementioned solvents, to which dimethyl sulfoxide, dimethylformaldehyde or N-methylpyrrolidinone is added.

It is also possible to preferably employ, as the organic solvent, propionic acid derivatives such as methyl methylpropionate, etc.; lactates such as ethyl lactate, etc.; and PGMEA (propyleneglycol monomethylether acetate) since these compounds are low in toxicity.

Incidentally, these organic solvents may be employed singly or in combination of two or more. Further, these organic solvents may contain aliphatic alcohol such as isopropyl alcohol, ethyl alcohol, methyl alcohol, butyl alcohol, n-butyl alcohol, s-butyl alcohol, t-butyl alcohol, isobutyl alcohol, etc.; and aromatic solvent such as toluene, xylene, etc.

The photosensitive hydrofluoric acid etching resist materials may further contain an alkali-soluble resin for enhancing the solubility thereof to an alkaline developing solution in the developing step; a resinous compound which is capable of enhancing the solubility to an alkaline developing solution as it is irradiated with radiation which will be effected for the purpose of enhancing the resolution at the time of optical patterning; a solubility inhibitor for decreasing the solubility of resin to alkaline developing solution in the developing step; a crosslinking agent for retaining the configuration of pattern of photosensitive hydrofluoric acid etching resist material after the optical patterning step; a surfactant for modifying the coated film; or an amine additive for preventing the deactivation of the acid generated in an optical reaction.

The photosensitive hydrofluoric acid etching resist materials according to this embodiment can be applied to the manufacture of semiconductor devices. The semiconductor device herein means a device which is provided with a single body or compound of semiconductor element and which can be manufactured by using fine fabrication techniques. More specifically, the semiconductor device herein means a device to which optical pattern etching by hydrofluoric acid etching is suitably applicable. This optical pattern etching will be explained below in more detail.

This optical pattern etching is performed by a process comprising a resist coating step, an exposure step, a heating step, a developing step and an etching step using hydrofluoric acid.

First of all, in the resist coating step, a layer of a photosensitive hydrofluoric acid etching resist material according this embodiment is formed on the substrate made of semiconductor or quartz glass by spin coating method, etc. Herein, quartz glass means a high-purity quartz glass which can be worked by using fine fabrication technique. Generally, this kind of quartz glass may contain as an impurity metal elements each at a ratio of 1 ppb at most.

Next, in the photo-exposure process (PEP) step, the layer of the photosensitive hydrofluoric acid etching resist material is irradiated, through a desired pattern, with light of desired pattern. In this exposure step, acid generates due to the employment of a photoacid generating agent.

Next, in the post-exposure bake (PEB) step, heat is applied to a substrate. In this heating step, in the exposed portions where acid catalyst generates in the previous step, the tertiary carbon atom existing between the alicyclic group $R^{12}$ and the main chain is decomposed and carboxylic acid is generated. Due to the decomposition reaction of this first segment, a portion of the photosensitive hydrofluoric acid etching resist material which is located in the exposed regions changes the solubility thereof from alkali-insoluble to alkali-soluble. Incidentally, the heating temperature (PEB temperature) in this heating step should preferably be confined within the range of 100° C. to 160° C., and heating time should preferably be confined within the range of 80 seconds to 100 seconds. In order to enable the dissociation reaction to take place within several minutes in this PEB, a temperature of 100° C. or more is required. On the other hand, when the temperature is raised more than 160° C., the dissociation reaction takes place without necessitating the presence of acid, thereby making it difficult to perform the patterning.

Next, in the developing step, the substrate is immersed in an alkaline developing solution. In this developing step, a portion of the photosensitive hydrofluoric acid etching resist material which is located in the exposed regions dissolves. With respect to the concentration of the alkaline developing solution, in the case of tetrahydroammonium hydroxide (TMAH) developing solution which is generally employed for semiconductor resists, the concentration of TMAH should preferably be confined within the range of 0.05% to 0.5%, more preferably around 0.12%. Since the concentration of the TMAH developing solution is 2.38% in general, it is possible to obtain a developing solution of desired concentration by diluting this TMAH developing solution with as about 20 times as large volume of water. The period of time required for the development using the TMAH developing solution of this desired concentration would be within the range of 30 seconds to 90 seconds. However, the actual period of time should be adjusted depending on the concentration of the TMAH developing solution.

Next, in the etching step, the substrate is immersed in a solution containing hydrofluoric acid at a concentration ranging from 30% to 50%. By employing an etching solution containing hydrofluoric acid at a concentration of 30% or more, the period of this immersion step would be prominently shortened. Incidentally, the stock solution of hydrofluoric acid generally contains hydrofluoric acid at a concentration ranging from 46 to 50% (see Dictionary of Physics and Chemistry; Iwanami Book Co., Ltd.). In this etching step, a portion of the substrate which was exposed to light is etched away.

Finally, on the occasion of removing the resist, the substrate is entirely exposed to light and then immersed in an alkaline developing solution to remove the photosensitive hydrofluoric acid etching resist material.

As for the substrate, it is possible to employ a semiconductor substrate, a quartz glass substrate, etc.

As for the specific examples of the semiconductor substrate, they include compound semiconductors such as GaP, GaAs, GaAsP, AlGaAs, InGaAsP, GaInAlP, InP, etc.; as well as elemental semiconductors such as Si, Ge, etc.

If a quartz glass substrate is to be employed, it is preferable to apply an anti-reflection lower film to the bottom surface of substrate in order to suppress the reflection of light at the bottom surface of the substrate.

As explained above, since the photosensitive hydrofluoric acid etching resist material according to this embodiment is employed, it is possible to perform the etching using a solution containing hydrofluoric acid at a high concentration. As a result, the time period required for the optical patterning etching step can be shortened.

Further, the photosensitive hydrofluoric acid etching resist material according to this embodiment can be applied to the manufacture of the semiconductor devices as explained below. For example, this etching material can be applied to the manufacturing method which comprises: forming a sacrificial layer made of quartz glass on the semiconductor substrate; forming an element structure made of semiconductor on the sacrificial layer; forming a portion made of a material which is poor in hydrofluoric acid resistance on the semiconductor substrate; subsequently covering the portion made of a material which is poor in hydrofluoric acid resistance by using the photo-sensitive hydrofluoric acid etching material according to this embodiment; and subsequently removing the sacrificial layer by applying a hydrofluoric acid solution to the semiconductor substrate.

Next, an optical scanning apparatus representing one example of the semiconductor device according to one embodiment of the present invention will be explained in detail. First of all, one example of the optical scanning apparatus will be explained with reference to FIGS. 14A, 14B and 15.

Figure 14A:
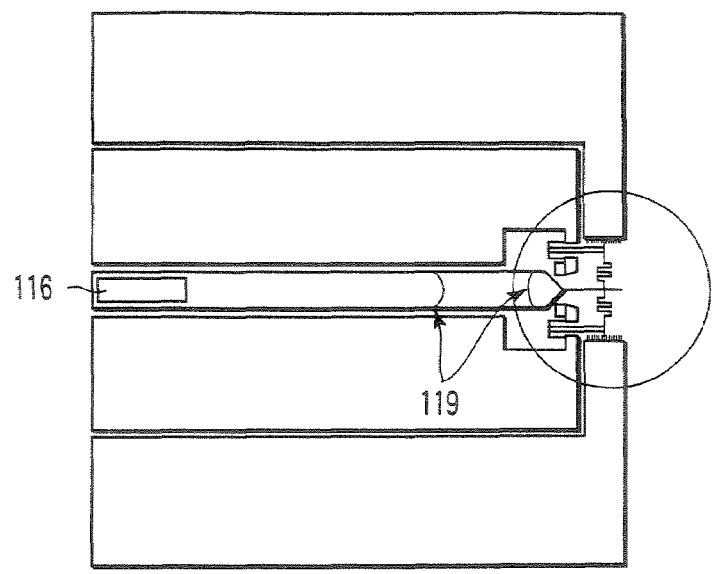
FIGS. 14A and 14B show respectively a top view illustrating an optical scanning apparatus representing another embodiment of the present invention.
Figure 14B:
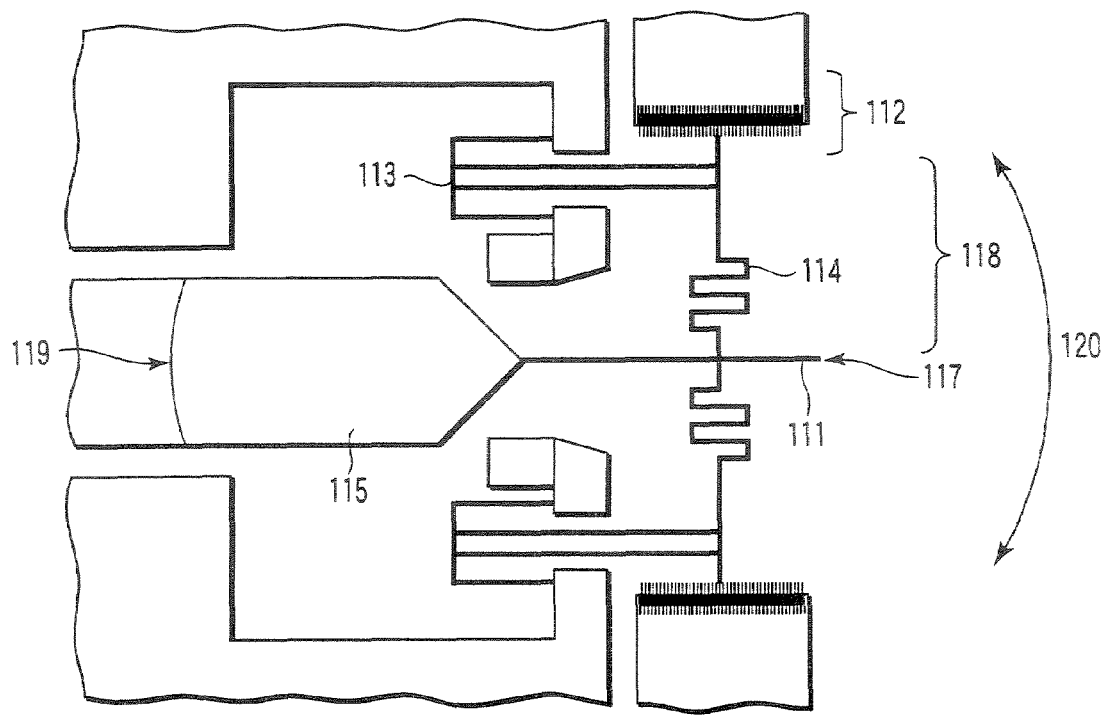
Figure 15:
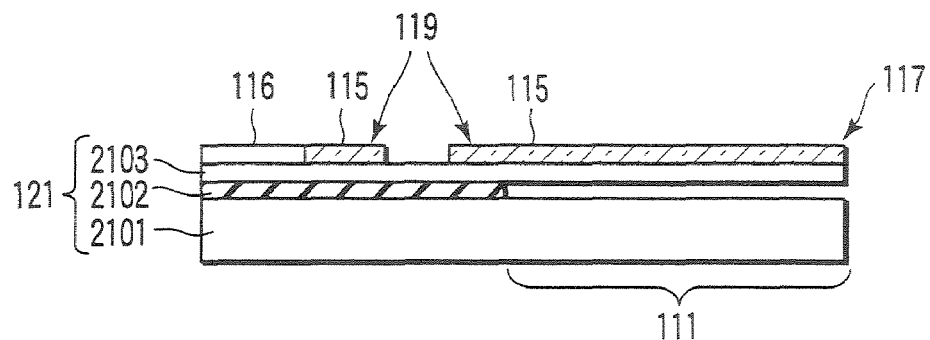
FIG. 15 shows a partial sectional view schematically illustrating an optical scanning apparatus representing another embodiment of the present invention.

FIG. 14A is a top view schematically illustrating the optical scanning apparatus. FIG. 14B is an enlarged view schematically illustrating an encircled region of FIG. 14A. FIG. 15 is a cross-sectional view schematically illustrating the central axis of the beam-like structure 111 of the optical scanning apparatus.

As shown in FIGS. 14A and 14B, the scanning beam is emitted from a light source 116, then passes through an optical waveguide structure 115 for guiding the beam and through a beam-condensing structure 119, and thereafter is emitted out of the light emitting end 117 of the optical waveguide, which is located at an distal end of the beam-like structure 111.

A tandem gear type driving mechanism 112 is employed for generating power for driving the beam-like structure 111. There is provided a coupling structure 118 for coupling the beam-like structure with the driving mechanism, the coupling structure 118 being constituted by a stabilizing spring structure 113, a bellows-like spring structure 114 and a beam structure linking them to each other.

The optical scanning apparatus constructed in this manner is operated such that the beam-like structure 111 is vibrated to vibrate also the light emitting end 117 of the optical waveguide to enable the beam from the light source 116 to perform the scanning. The beam vibrating direction 120 shown by an arrow in FIG. 14B indicates the direction of the scanning beam to be operated by this apparatus.

As shown in FIG. 15, an SOI substrate 121 constituting the substrate of the element structure is constituted by a laminate structure comprising, when mentioned from below, a Si substrate 2101, a $SiO_2$ layer 2102 and a Si active layer 2103. On this SOI substrate 121, there are disposed the aforementioned light source 116, the beam-condensing structure 119 and the optical waveguide structure 115.

In the case of this optical scanning apparatus, the optical waveguide structure 115 is formed of a material exhibiting a low hydrofluoric acid resistance, and the step of performing the hydrofluoric acid etching is utilized in the step of manufacturing a movable portion (for example, the beam-like structure 111) of the element structure, i.e. the step of removing the SiO₂ layer 2102 to be used as a sacrificial layer.

Next, the method of manufacturing the optical scanning apparatus shown in FIGS. 14A, 14B and 15 will be explained.

First of all, after the fabrication of the optical waveguide structure 115 on the SOI substrate, the element structure is formed.

Thereafter, the portion formed of a material exhibiting a low hydrofluoric acid resistance is covered by using the photosensitive hydrofluoric acid etching resist material according to this embodiment. As for the examples of the portion to be covered in this manner, they include the light source 116 and the optical waveguide structure 115 (including the beam-like structure 111, the beam-condensing structure 119 and the light emitting end 117). On the other hand, the movable portions of the element structure such as the tandem gear type driving mechanism 112, the stabilizing spring structure 113, a bellows-like spring structure 114 and a coupling structure 118 coupling the beam-like structure with the driving mechanism are kept exposed. Incidentally, the SiO₂ layer 2102 located immediately below the beam-like structure 111 is kept exposed. Thereafter, the hydrofluoric acid etching is performed so as to remove the SiO₂ layer 2102 as a sacrificial layer and the movable portion of the element structure is made free from the Si substrate 2101. Details of the method are almost the same as the optical patterning etching method which was already explained above.

By covering with the photosensitive hydrofluoric acid etching resist material of this embodiment in this manner, it is possible to remove the sacrificial layer to make the element structure movable without destroying the optical waveguide structure 115 which is composed of a material of low hydrofluoric resistance.

In this case, if the hydrofluoric acid etching material is not photosensitive and hence it is impossible to perform the hydrofluoric acid etching after the formation of the optical waveguide structure 115, the optical waveguide structure 115 is required to be formed, after the hydrofluoric acid etching step, on the SOI substrate 121 having the movable portion and being complicated in structure. This leads to the complication of the manufacturing steps of semiconductor devices.

Further, if the concentration of hydrofluoric acid is low on the occasion of hydrofluoric acid etching, the step of hydrofluoric acid etching would be prolonged.

The photosensitive hydrofluoric acid etching resist material according to this embodiment may not necessarily be required to be removed after finishing the manufacture of a semiconductor device. This manufacturing method of semiconductor devices will be explained as follows. Namely, this manufacturing method comprises: forming a portion formed of a material exhibiting high hydrofluoric acid resistance on the semiconductor substrate; forming a portion formed of a material exhibiting low hydrofluoric acid resistance on the portion formed of a material exhibiting high hydrofluoric acid resistance; covering the portion formed of a material exhibiting low hydrofluoric acid resistance by using the photosensitive hydrofluoric acid etching resist material of this embodiment; and etching the portion formed of a material exhibiting high hydrofluoric acid resistance by using a hydrofluoric acid solution.

Next, an LED representing one example of the semiconductor device according to one embodiment of the present invention will be explained in detail. First of all, one example of the LED will be explained with reference to FIG. 16.

Figure 16:
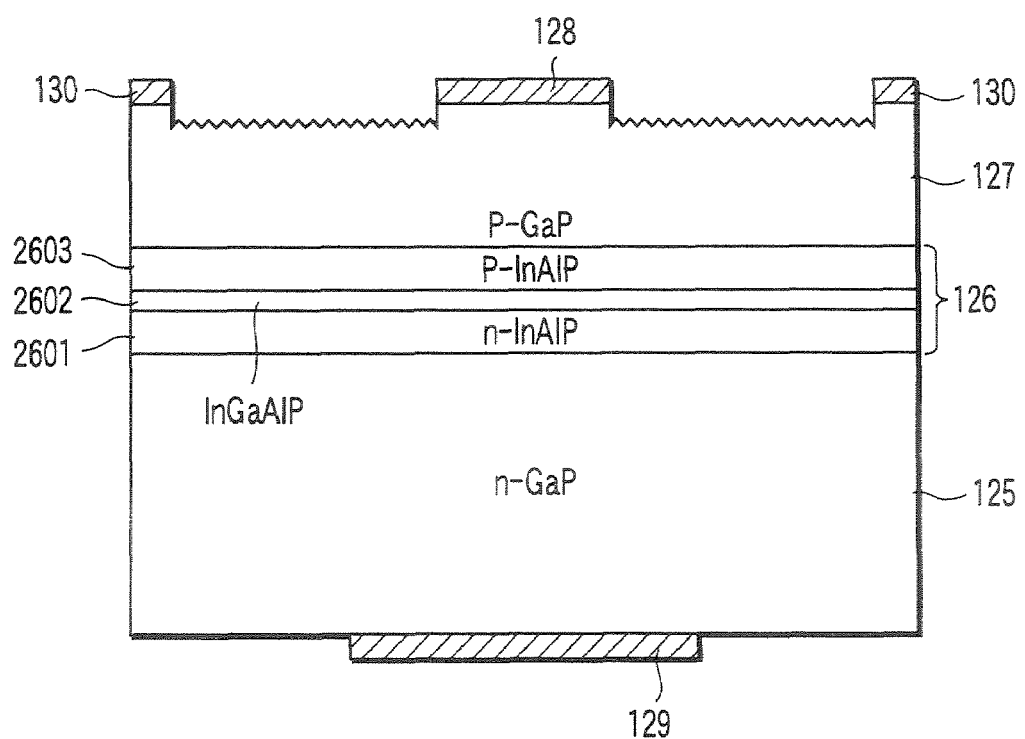
FIG. 16 shows a cross-sectional view schematically illustrating an LED representing another embodiment of the present invention.

The LED shown in FIG. 16 comprises: a compound semiconductor substrate 125 formed of n-GaP and provided on the bottom surface thereof with a first electrode 129; a light emitting layer 126 of hetero structure which is formed on the substrate, this light emitting layer 126 comprising a clad layer 2601 formed of n-InAlP, an active layer 2602 formed of InGaAlP and a clad layer 2603 formed of p-InAlP; a current diffusion layer 127 formed on the light emitting layer 126 and formed of p-GaP; a second electrode 128 formed on the current diffusion layer 127 and formed of Au; and a wiring electrode pattern 130.

In the case of this LED, the first electrode 129, the second electrode 128 and the wiring electrode pattern 130 are formed of a material exhibiting a low hydrofluoric acid resistance, and the hydrofluoric acid etching is performed in the step of applying a frost treatment on the surface of the current diffusion layer 127.

Incidentally, this frost treatment means a treatment to form a rugged surface on the surface of compound semiconductor constituting an LED chip by applying hydrofluoric acid etching to the surface of compound semiconductor. By increasing the surface area of compound semiconductor constituting an LED chip, it is possible to enhance the light extracting efficiency.

Next, the method of manufacturing the LED will be explained with reference to FIG. 16 showing the LED.

First of all, by known techniques such as the metal organic chemical vapor deposition (MOCVD) method or molecular beam epitaxy (MBE) method, the clad layer 2601, the active layer 2602, the clad layer 2603 and the current diffusion layer 127 are successively formed on the compound semiconductor substrate 125.

Then, by the conventional lithography technique, sputtering technique and electrolytic plating technique, the first electrode 129, the second electrode 128 and the wiring electrode pattern 130 are formed.

Subsequently, by spin-coating method, the photosensitive hydrofluoric acid etching resist material of this embodiment is coated on the current diffusion layer 127. Thereafter, by using a mask having a pattern formed therein so as to cover the second electrode 128 and the wiring electrode pattern 130, the substrate is subjected to a series of steps including exposure, PEB, development, hydrofluoric acid etching and the removal of protecting film. The details of these steps may be the same as already explained with reference to the optical pattern etching method. In this case, the step of hydrofluoric acid etching corresponds to so-called frost treatment.

Subsequently, the substrate is subjected to dicing treatment to partition it into a plurality of chips, and then, wiring is connected with the first electrode 129 and the second electrode 128 to accomplish the manufacture of the LED as shown FIG. 16.

In this case, if the hydrofluoric acid etching resist material is not photosensitive and hence it is impossible to perform the hydrofluoric acid etching after the formation of the first electrode 129, the second electrode 128 and the wiring electrode pattern 130, these components are required to be formed on the rugged surface after the step of frost treatment, thus resulting in the complication of the manufacturing steps of the LED. Otherwise, it would be difficult to perform the frost treatment on the surfaces of the compound semiconductor on which the first electrode 129, the second electrode 128 and the wiring electrode pattern 130 are formed, thereby making it impossible to improve the light extracting efficiency.

Further, if the concentration of hydrofluoric acid is low on the occasion of hydrofluoric acid etching, the step of hydrofluoric acid etching would be prolonged.

Incidentally, it is of course possible to perform the frost treatment also on the surface provided with the first electrode 129 of the compound semiconductor substrate 125 by the same method as described above.

As for the materials constituting the LED shown in FIG. 16, it is also possible to employ the following materials other than those shown in FIG. 16. Namely, as for the compound semiconductor substrate 125, it is possible to employ n-GaAs, n-GaP and p-GaP. As for the current diffusion layer 127, it is possible to employ p-InAlP and p-GaP. As for the first electrode 129, it is possible to employ AuGa/As and AuGe/As. As for the second electrode 128, it is possible to employ AuZn/Au, etc.

As explained above, it is now possible, through the employment of the photosensitive hydrofluoric acid etching resist material according to this embodiment, to perform the optical pattern etching method using a hydrofluoric acid solution of high concentration, thereby making it possible to simplify the process and shorten the time period in the manufacturing method of semiconductor devices.

As far as this manufacturing method is concerned, the step of removing the photosensitive hydrofluoric acid etching resist material is no longer required. Since the resin of this embodiment is excellent in transmittance in a wide range of wavelength, the manufacturing method of semiconductor devices using this resin would be especially useful in the manufacture of photochemical semiconductor devices such as an optical scanning apparatus, an LED, etc.

Although some examples will be explained below, the present invention would not be limited to these examples but can be variously modified as long as the inventive concept of the present invention can be retained.

The photosensitive hydrofluoric acid etching resist material of this embodiment was examined in various tests including (Test A) Hydrofluoric acid resistance test; (Test B) Process test; (Test C) Test on the main chain, alicyclic group and substituent group; (Test D) Composition dependency test; and (Test E) Optical scanning apparatus test.

(Test A) Hydrofluoric Acid Resistance Test:

The hydrofluoric acid corrosion/decomposition resistance of the resin itself was investigated.

In Example A1, the resin represented by the formula (PS2) (m:n=50:50) was immersed in an aqueous solution containing hydrofluoric acid at a concentration shown in Table 7. In this case, the hydrofluoric acid was suitably diluted by using concentrated hydrofluoric acid of 49% concentration (Tokyo Kasei Co., Ltd.).

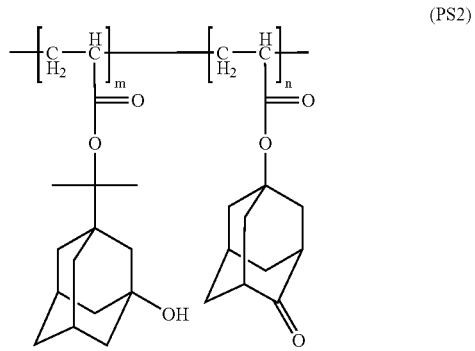

(PS2)

Incidentally, the resin represented by the formula (PS2) was synthesized by the aforementioned synthesizing method.

In Comparative Example A1, OFPR-800 (Tokyo Ohka Co., Ltd.) was employed as a photosensitive hydrofluoric acid etching resist material for novolac-based resin.

In Comparative Example A2, TDUR-P015 (Tokyo Ohka Co., Ltd.) was employed as a photosensitive hydrofluoric acid etching resist material for polyvinylphenol-based resin.

In Comparative Example A3, polymethylmethacrylate (PMMA) (Mw=15000, type No. 424, Scientific Polymer Product Inc.) was employed.

TABLE 7

| | Concentration of hydrofluoric acid | | | | | | |
|---|---|---|---|---|---|---|---|
| | 49% | 45% | 40% | 35% | 30% | 25% | 20% |
| Example A1 | ○ | ○ | ○ | ○ | ○ | ○ | ○ |
| Comp. Ex. 1 | X | X | X | X | X | ○ | ○ |
| Comp. Ex. 2 | X | X | X | X | X | ○ | ○ |
| Comp. Ex. 3 | X | X | X | X | X | X | ○ |

It will be recognized from the results shown in Table 7 that while the hydrofluoric acid corrosion/decomposition resistance of Example A1 was retained even if the concentration of hydrofluoric acid was 30% or more, the hydrofluoric acid corrosion/decomposition resistance of Comparative Examples A1 to A3 was retained only when the concentration of hydrofluoric acid was 25% or less. Since the photosensitive hydrofluoric acid etching resist material of this embodiment is excellent in hydrofluoric acid corrosion/decomposition resistance, the time required for the immersion thereof in hydrofluoric acid can be shortened.

On the other hand, when the materials of Comparative Examples A1 to A3 were respectively coated on the substrate and the coated substrates were immersed in an aqueous solution of hydrofluoric acid of 49% concentration, the materials of Comparative Examples A1 to A3 were found poor in adhesion to substrate and also in hydrofluoric acid penetrating resistance, thus enabling these materials to be easily removed. Whereas, as described hereinafter in the Tests B to D, the photosensitive hydrofluoric acid etching resist material of this embodiment was excellent in hydrofluoric acid penetrating resistance, thus making it possible to employ as a photosensitive hydrofluoric acid etching resist material.

It will be recognized from these facts that as compared with the conventional etching resist materials, the photosensitive hydrofluoric acid etching resist material of this embodiment is more excellent in hydrofluoric acid resistance.

The same experiments as performed on the photosensitive hydrofluoric acid etching resist material were also applied to the substrate.

As a result, it was found that while it was possible, in the case of etching a GaP substrate, to perform the etching using hydrofluoric acid at such a low concentration of about 20%, it was required however, in the case of etching a quartz glass substrate (QJ Asashi Glass Co., Ltd.), to employ hydrofluoric acid of not less than 30% in concentration if it was desired to prevent the prolongation of the immersion step. Therefore, if it is desired to employ a quartz glass substrate, the employment of the photosensitive hydrofluoric acid etching resist material of this embodiment is especially preferable.

(Test B) Process Test:

The process test of the photo lithography was performed.

The resin represented by the formula (PS2), and 1 wt % (based on the resin) of (4,7-dihydroxy-1-naphthalenyl)dimethylsulfonium trifluoromethane sulfonic acid (NDS-165; Midori Kagaku Co., Ltd.) were mixed together and dissolved in propylene glycol mono methyl ether acetate (PGMEA) (Wako Junyaku Co., Ltd.) employed as a solvent, thereby preparing varnish containing the resin at a concentration of 20 wt %.

By setting the rotational speed to 1500 rpm in spin coating, the photosensitive hydrofluoric acid etching resist material was coated on each of the substrates shown in Table 8. Thereafter, the layer coated was prebaked for 90 seconds at a temperature of 120° C. to vaporize the solvent. As a result, a layer of the photosensitive hydrofluoric acid etching resist material having a thickness of 0.86 μm was obtained.

Then, by using a mask provided with a line & space pattern, the layer was exposed to the irradiation of g-ray of mercury lamp at an exposure dosage of 400 mJ/cm$^2$ by using a parallel exposure apparatus (Canon Co., Ltd.; type: PLA-501). The irradiation was performed by directly superimposing the mask on the substrate, thereby achieving a magnification exposure of 1:1.

Then, the substrate was heated over a hot plate for 90 seconds at a temperature of 110° C. (PEB temperature).

Then, by using an alkaline developing solution composed of a solution which was obtained by diluting an aqueous solution of tetramethyl ammonium hydroxide (2.38% TMAH) (Tama Kagaku Co., Ltd.; type No. AD-10) with pure water as shown in Table 8, the development of the coated layer was performed for 60 seconds to form a pattern, the surface of which was then observed by using a super depth shape measuring microscope (Keyence Co., Ltd.; type No. VK-8500), thereby confirming the resolution of the pattern.

Subsequently, the substrate was immersed in an aqueous solution of hydrofluoric acid of 49% concentration (Tokyo Kasei Co., Ltd.) for 10 minutes.

Then, by using a parallel exposure apparatus (PLA-501), the substrate was exposed to g-line of mercury lamp at an exposure dosage of 400 mJ/cm$^2$ and then the substrate was heated over a hot plate for 90 seconds at a temperature of 110° C. Finally, the substrate was immersed in alkaline developing solution (AD-10 (2.38% TMAH); Tama Kagaku Co., Ltd.) for 60 seconds to dissolve and remove all of the photosensitive hydrofluoric acid etching resist material. The surface of the substrate thus obtained was then observed by using a super depth shape measuring microscope (Keyence Co., Ltd.; type No. VK-8500), thereby confirming the resolution of the pattern.

The resolution of the photosensitive hydrofluoric acid etching resist material subsequent to the developing step and the resolution of the substrate after finishing all of the steps are shown in the following Table 8.

TABLE 8

| | Substrate | Degree of diluting alkaline developing solution | Resolution of photosensitive composition after developing step (μmL/S) | Resolution of substrate after entire steps (μmL/S) |
| --- | --- | --- | --- | --- |
| Ex. B3 | GaP | 20 times | 7 | 8 |
| Ex. B4 | Quartz | 20 times | 7 | 8 |

It will be recognized from the results shown in Table 8 that the photo lithography method using the photosensitive hydrofluoric acid etching resist material of this embodiment was capable of obtaining a pattern having a resolution of about 8 μmL/S through the exposure using the g-line of mercury lamp, thereby making it possible to provide excellent resolution.

It will be also recognized from the results shown in Table 8 that the degree of dilution of the alkaline developing solution should preferably be set to 20 times.

(Test C) Test on the Main Chain, Alicyclic Group and Substituent Group:

EXAMPLE C1

A test was performed in the same manner as that of Example B3 except that the resin represented by the formula (PS2) (m:n=50:50) was employed and the PEB temperature was changed to 120° C. was performed.

EXAMPLE C2

A test was performed in the same manner as that of Example C1 except that the resin represented by the formula (PS3) (m:n=50:50) was employed.

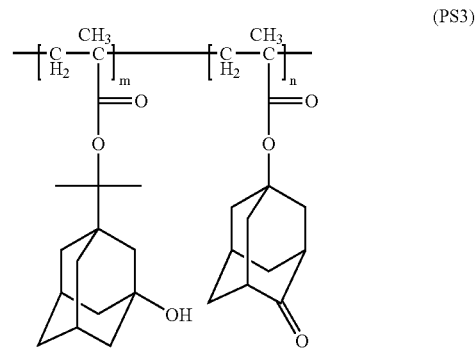

(PS3)

EXAMPLE C3

A test was performed in the same manner as that of Example C1 except that the resin represented by the formula (PS4) (m:n=40:60) was employed.

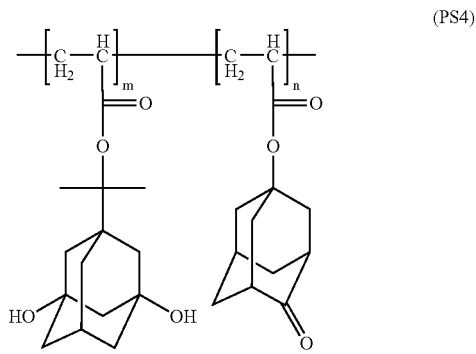

(PS4)

EXAMPLE C4

A test was performed in the same manner as that of Example C1 except that the resin represented by the formula (PS5) (m:n=40:60) was employed.

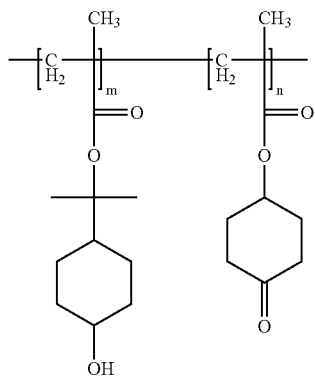

(PS5)

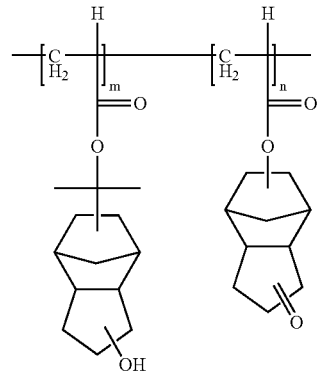

(PS7)

The results of these test thus obtained are shown in Table 9.

TABLE 9

| | Resin | | | | Results of test | |
|---|---|---|---|---|---|---|
| | Main chain | Alicyclic | Number of OH | m:n (mol) | Resolution of substrate after entire steps (μmL/S) | Concentrated hydrofluoric acid (49%) resistance |
| Ex. C1 | Acrylate | Adamantane | 1 | 50:50 | 7.0 | 60 min. or more |
| Ex. C2 | Methacrylate | Adamantane | 1 | 50:50 | 20.0 | 60 min. or more |
| Ex. C3 | Acrylate | Adamantane | 2 | 40:60 | 5.0 | 10 min. |
| Ex. C4 | Methacrylate | Cyclohexane | 1 | 40:60 | 3.0 | 30 min. |
| Ex. C5 | Acrylate | Isobornene | 1 | 50:50 | 8.0 | 60 min. or more |
| Ex. C6 | Acrylate | Tricyclodecane | 1 | 60:40 | 12.0 | 60 min. or more |

EXAMPLE C5

A test was performed in the same manner as that of Example C1 except that the resin represented by the formula (PS6) (m:n=50:50) was employed.

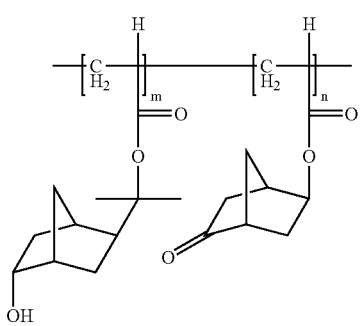

(PS6)

EXAMPLE C6

A test was performed in the same manner as that of Example C1 except that the resin represented by the formula (PS7) (m:n=60:40) was employed.

The resin of Example C1 was more excellent in resolution and hydrofluoric acid resistance as compared with the resin of Example C2. Therefore, it will be recognized that the main chain should more preferably be constituted by acrylate rather than methacrylate.

The resin of Example C1 was more excellent in resolution and hydrofluoric acid resistance as compared with the resin of Example C3. Therefore, it will be recognized that the number of hydroxyl group should most preferably be only one.

The resin of Example C4 was more excellent in resolution, though hydrofluoric acid resistance was somewhat inferior, as compared with the resins of Example C1, C5 and C6. Therefore, it will be recognized that the resin where the alicyclic group was constituted by cyclohexane would be more preferable for use in the application where a higher resolution is desired.

Incidentally, although a desirable magnitude of resolution and hydrofluoric acid resistance may differ depending on the application, it is assumed practically sufficient if the resolution is several tens of μmL/s, and the hydrofluoric acid resistance is about 5 minutes.

It was confirmed that even if a resin wherein norbornene was introduced therein as an alicyclic group was employed, it was possible to obtain almost the same results as described above. Further, although a resin wherein cyclooctane was introduced therein was found somewhat inferior in hydrofluoric acid resistance, the resolution thereof was excellent so that the resin was found quite satisfactory in practical use.

(Test D) Composition Dependency Test:

By changing the composition ratio of m:n of the resin represented by the formula (PS2), tests were performed in the same manner as explained in Test B. The results of these test thus obtained are shown in Table 10.

TABLE 10

| | M:n (mol) | Resolution of substrate after entire steps (μmL/S) | Concentrated hydrofluoric acid (49%) resistance |
|---|---|---|---|
| Ex. D3 | 30:70 | 50 | 60 min. or more |
| Ex. D4 | 40:60 | 12.0 | 60 min. or more |
| Ex. D5 | 50:50 | 7.0 | 60 min. or more |
| Ex. D6 | 60:40 | 4.0 | 30 min. |
| Ex. D7 | 70:30 | 2.0 | 10 min. |
| Ex. D8 | 80:20 | 2.0 | 1 min. or less |
| Ex. D9 | 90:10 | 2.0 | 1 min. or less |

When the ratio between m:n was confined within the range of 30:70 to 70:30, the resolution and hydrofluoric acid resistance of the resin were both preferably increased.

Incidentally, the aforementioned composition ratio m:n shown in Table 10 is expressed by the ratio of monomers charged on the occasion of the polymerization of resin. The method of polymerizing the resin of this embodiment was a synthesizing method which was designed to obtain a relatively high yield. The difference between the ratio of monomers charged on the occasion of the polymerization of resin and the ratio of segments m:n after the polymerization of resin was very limited, falling within an allowable error.

However, if a method enabling a shortened reaction time is employed, the reaction would be taken place from the monomers which are more reactive, thereby exhibiting a tendency of decreasing the generation of bulky segment. As a result, there may be occurred a difference between the ratio of monomers and the ratio of segments, thus necessitating suitable adjustment of these ratios. When non-uniformity of these ratios depending on the selection of synthesizing methods is taken into account, a preferable range of composition in terms of the ratio of monomers (m:n) is assumed to be confined within the range of 25:75 to 75:25.

(Test E) Optical Scanning Apparatus Test:

By using the photosensitive hydrofluoric acid etching resist material of this embodiment, the optical scanning apparatus shown in FIGS. 14A, 14B and 15 was manufactured. Incidentally, in this optical scanning apparatus thus manufactured, the width and length of the beam located at the center of the element constituting a main point of the scanning were 10 μm and 1300 μm, respectively.

The method of manufacturing the optical scanning apparatus shown in FIGS. 14A, 14B and 15 will be explained with reference to FIGS. 17A to 17I.

FIGS. 17A to 17I are schematic partial sectional views each illustrating method of manufacturing the optical scanning apparatus.

Figure 17A:
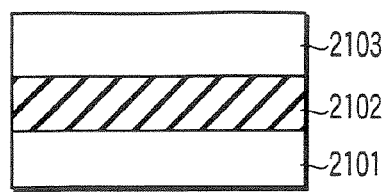
FIGS. 17A to 17I show respectively a cross-sectional view schematically illustrating a method of manufacturing an optical scanning apparatus employed in a test (E).

As shown in FIG. 17A, the substrate to be employed in the element manufacturing process is formed of an SOI substrate 121, which can be manufactured by connecting a Si active layer 2103 via an $SiO_2$ layer 2102 onto a Si substrate 2101. In this Test E, the SOI substrate 121 (available from Toshiba Ceramics Co., Ltd.) was constructed such that the Si substrate 2101 was formed of non-doped silicon, the $SiO_2$ layer 2102 was formed to have a thickness of 2 μm, and the Si active layer 2103 was formed of n-type high-doped silicon.

Figure 17B:
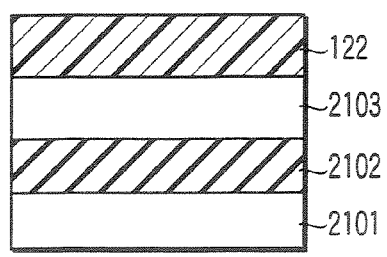

As shown in FIG. 17B, a resist layer 122 is coated on the SOI substrate 121. Thereafter, various portions corresponding respectively to a beam-like structure 111 constituting a component element of the optical scanning apparatus, a movable element structure comprising a coupling structure 118 connecting the beam-like structure with a driving structure and a tandem gear type driving mechanism 112, and an optical wave guide structure 115 are exposed to light.

Figure 17C:
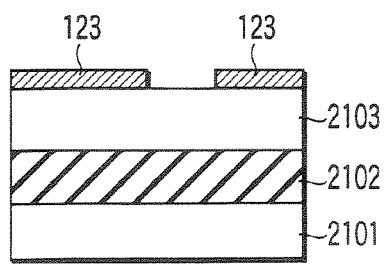

As shown in FIG. 17C, by chemical vapor deposition (CVD), a metallic membrane layer 123 is formed on the exposed portions. Thereafter, the resist layer 122 is removed to obtain a pattern of the metallic thin film 123 which corresponds to the element structure.

Figure 17D:
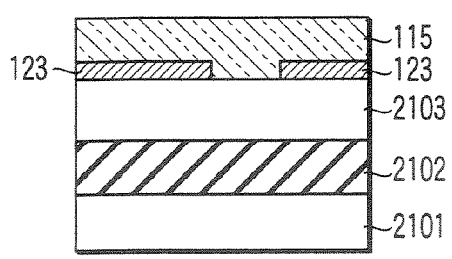

As shown in FIG. 17D, a raw material to be formed into the optical wave guide structure 115 is coated on the SOI substrate 121 provided with the pattern of the metallic thin film 123.

Figure 17E:
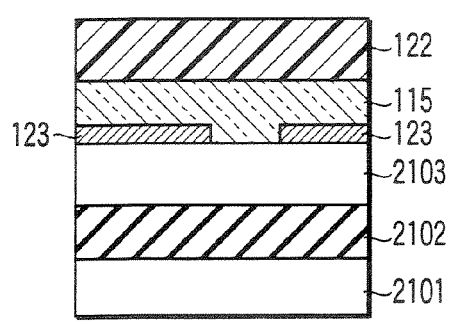

As shown in FIG. 17E, a resist layer 122 is coated on a layer of raw material to be turned into the optical wave guide structure 115.

Figure 17F:
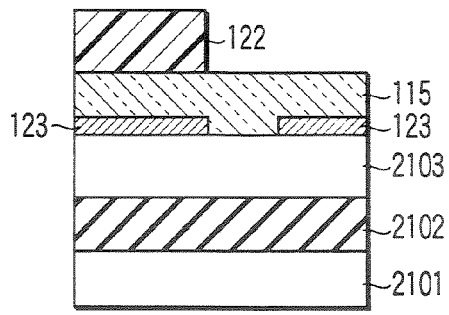

As shown in FIG. 17F, the resultant substrate is subjected to exposure and development so as to cover the top surface of the portion to be turned into the optical wave guide structure 115.

Figure 17G:
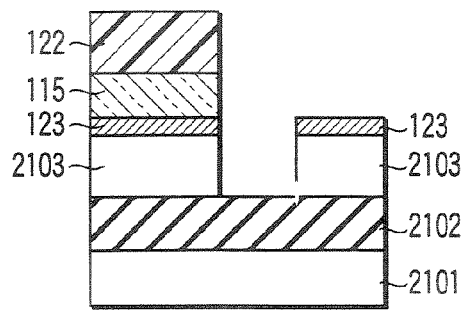

As shown in FIG. 17G, by reactive ion etching (RIE), portions other than the portion to be turned into the optical wave guide structure 115 are cut out. On the occasion, in the surface on which the metallic thin film 123 is not formed, the Si active layer 2103 is also cut out.

Figure 17H:
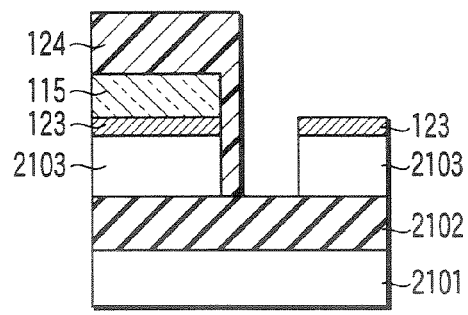

As shown in FIG. 17H, the resist layer 122 is removed and then by using the photosensitive hydrofluoric acid etching resist material of this embodiment, the optical wave guide structure 115 is protected.

Figure 17I:
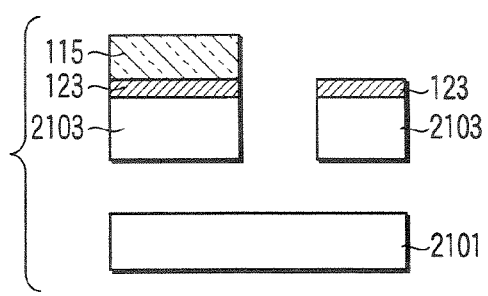

As shown in FIG. 17I, by hydrofluoric acid etching, the $SiO_2$ layer 2102 to be used as a sacrificial layer is removed. As a result of this step, the element structure is made movable. Incidentally, the specific conditions on this occasion are the same as those of Test B.

As explained above, in the case of the optical scanning apparatus manufactured in this Test E, since the etching of the sacrificial layer can be performed after the manufacture of the optical wave guide structure 115, the manufacturing method of the apparatus can be simplified and the time required for the manufacture thereof can be shortened.

According to this embodiment, there are provided a photosensitive hydrofluoric acid etching resist material which is excellent in hydrofluoric acid resistance, an optical pattern etching method which enables concentrated hydrofluoric acid etching, and a method of manufacturing a semiconductor device which makes it possible to simplify the manufacturing process and to shorten the time required for the manufacture.

While various embodiments of the present invention have been explained above, it is evident that the present invention is not restricted to these embodiments but can be modified variously without departing the essential characteristics thereof described in the appended claims. Further, in actual use, the present invention can be modified variously without departing the essential characteristics thereof. Furthermore, a plurality of constituent elements disclosed in the foregoing embodiments may be optionally combined to form various embodiments of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming a layer of a photosensitive etching resistance material on a substrate made of semiconductor or quartz glass, the photosensitive etching resistance material comprising an acid etching resistance material composed of a resin having at least two kinds of repeating units represented by the following general formula (PS1); and a photo acid generator which is capable of generating an acid as it is irradiated with light:

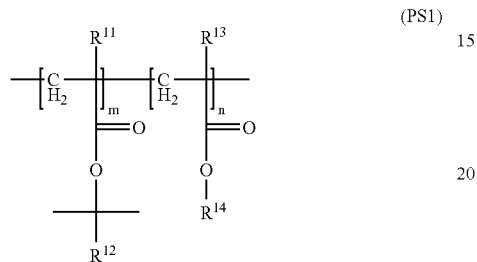

wherein in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone group; and m and n represent individually a natural number:

subjecting the substrate to patterning exposure;

heating the substrate;

subjecting the substrate to a developing treatment using an alkaline developing solution to remove an exposed portion of the layer; and subjecting the substrate to a fluoric acid etching treatment using a solution containing fluoric acid at a concentration ranging from 30% to 50%.

2. The method according to claim 1, wherein the substrate is heated at a temperature within the range of 100° C. to 160° C.

3. The method according to claim 1, wherein the solution contains fluoric acid at a concentration of 40% or more.

4. The method according to claim 1, wherein the resin having at least two kinds of repeating units represented by the general formula (PS1) is selected from the following:

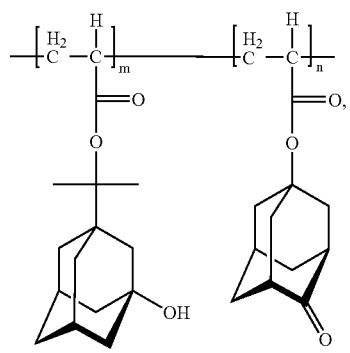

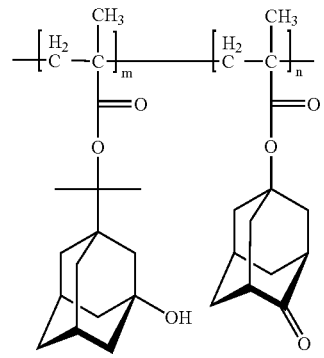

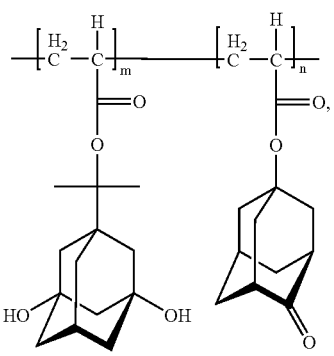

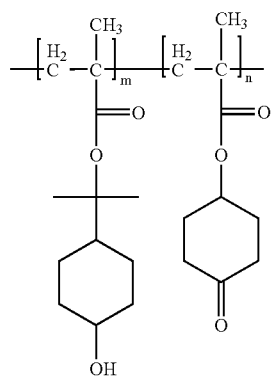

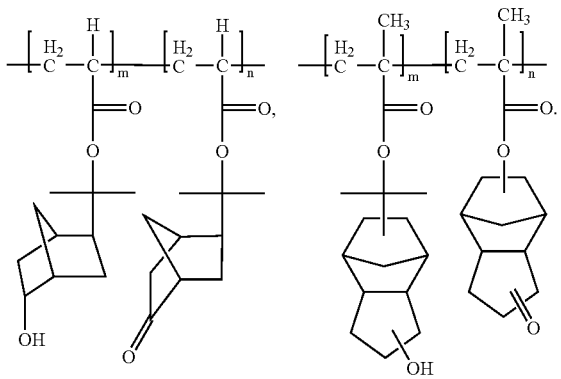

5. A method of manufacturing a semiconductor device comprising:

forming a sacrificial layer composed of quartz glass on a semiconductor substrate;

forming an element structure composed of semiconductor on the sacrificial layer;

forming a region composed of a material which is poor in hydrofluoric acid resistance on the semiconductor substrate;

covering the region composed of a material which is poor in hydrofluoric acid resistance with a photosensitive etching resistance material comprising an acid etching resistance material composed of a resin having at least two kinds of repeating units represented by the following general formula (PS1); and a photo acid generator which is capable of generating an acid as it is irradiated with light:

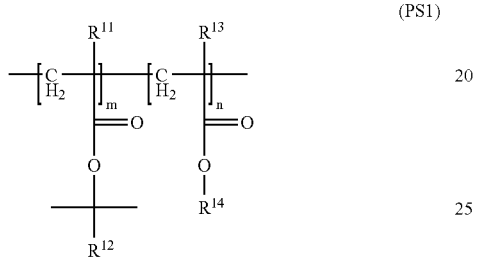

(PS1)

wherein in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone group; and m and n represent individually a natural number; and removing the sacrificial layer by applying a hydrofluoric acid solution to the semiconductor substrate.

6. The method according to claim 5, wherein the region composed of a material which is poor in hydrofluoric acid resistance is an optical waveguide structure.

7. The method according to claim 5, wherein the hydrofluoric acid solution contains fluoric acid at a concentration of 40% or more.

8. The method according to claim 5, wherein the resin having at least two kinds of repeating units represented by the general formula (PS1) is selected from the following group:

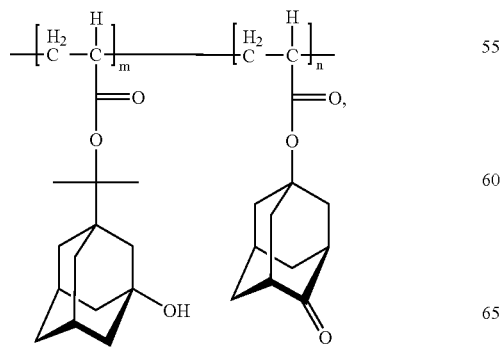

-continued

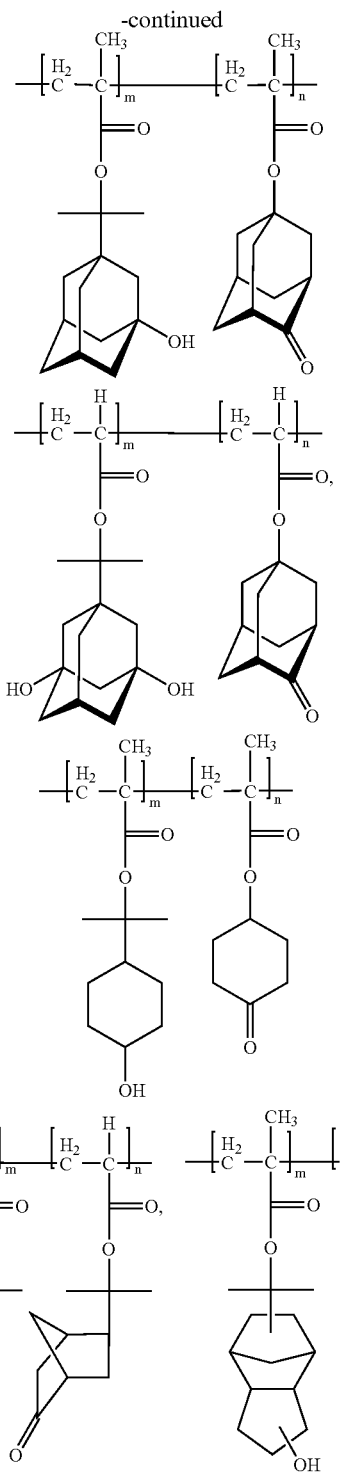

9. A method of manufacturing a semiconductor device comprising:

forming a region of a material which is excellent in hydrofluoric acid resistance on a semiconductor substrate;

forming a region of a material which is poor in hydrofluoric acid resistance over the region which is composed of a material which is excellent in hydrofluoric acid resistance;

covering the region which is poor in hydrofluoric acid resistance with a photosensitive etching resistance material comprising an acid etching resistance material composed of a resin having at least two kinds of repeating units represented by the following general formula (PS1); and a photo acid generator which is capable of generating an acid as it is irradiated with light:

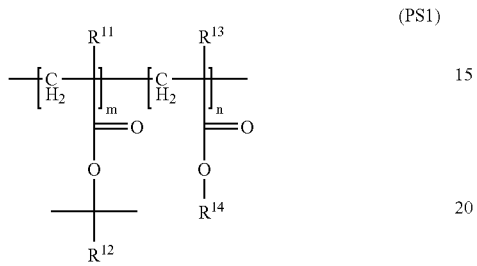

(PS1)

wherein in the general formula (PS1), $R^{11}$ and $R^{13}$ are individually a hydrogen atom or methyl group; $R^{12}$ is selected from the group consisting of adamantane, tricyclodecane, norbornane, isobornane, cyclohexane and cyclooctane, each having one or two hydroxyl groups; $R^{14}$ is selected from the group consisting of adamantane, tricyclodecane, norbornane, isobornane, cyclohexane and cyclooctane, each having one ketone group; and m and n represent individually a natural number; and subjecting the region which is composed of a material which is excellent in hydrofluoric acid resistance to an etching treatment using a solution of hydrofluoric acid.

10. The method according to claim 9, wherein the etching treatment using the solution of hydrofluoric acid is a frost treatment.

11. The method according to claim 9, wherein the solution of hydrofluoric acid contains fluoric acid at a concentration of 40% or more.

12. The method according to claim 9, wherein the resin having at least two kinds of repeating units represented by the general formula (PS1) is selected from the following group:

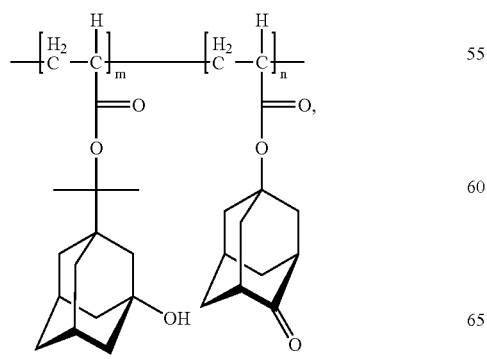

-continued

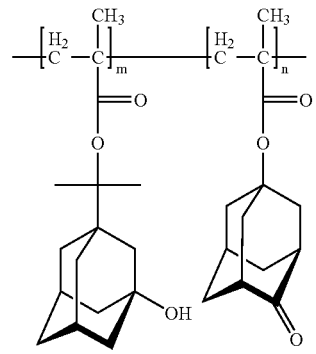

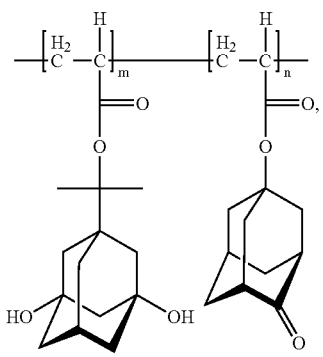

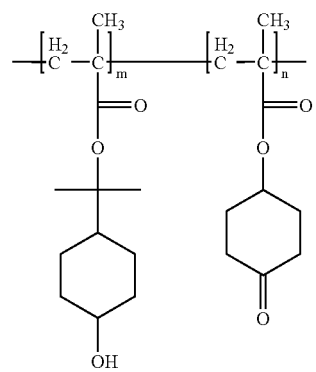

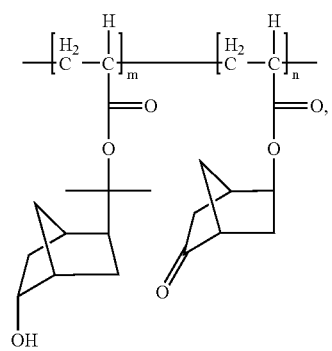

-continued

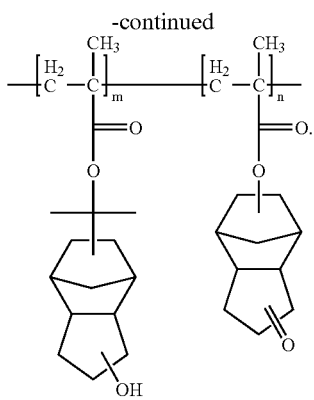

13. A method of manufacturing a semiconductor device having a roughened surface comprising a semiconductor substrate; a first electrode; a light emitting layer formed above the semiconductor substrate; and a second electrode; said method comprising:

forming a protective film above a part of surfaces of the semiconductor device, the semiconductor device having an exposed surface, the protective film comprising an acid etching resistance material having a repeating unit represented by the following general formula (1):

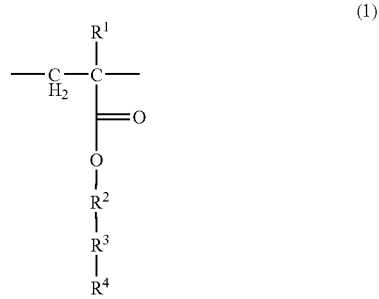

wherein in the general formula (1), $R^1$ is a hydrogen atom or a methyl group; $R^3$ is a cyclic group selected from the group consisting of an alicyclic group and an aromatic group; $R^4$ is a polar group; and $R^2$ is a group represented by the following general formula (2):

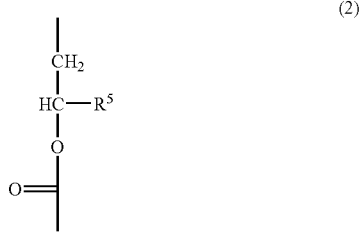

wherein in the general formula (2), $R^5$ is a hydrogen atom or a methyl group;

immersing the semiconductor device into an acid solution, thereby etching the exposed surface of the semiconductor device to form the roughened surface; and removing the protective film.

14. The method of claim 13, wherein the protective film covers at least the first electrode and the second electrode.

15. The method of claim 13, further comprising dicing the semiconductor substrate prior to immersing the semiconductor device into the acid solution and the exposed surface is a side surface of the semiconductor substrate.

16. The method according to claim 13, wherein the acid solution in which the semiconductor device is immersed is concentrated hydrofluoric acid.

17. The method according to claim 16, wherein the concentrated hydrofluoric acid contains hydrofluoric acid at a concentration of 25% or more.

18. The method according to claim 13, further comprising treating the semiconductor device with an acid etching solution prior to immersing the semiconductor device into the acid solution.

19. The method according to claim 18, wherein the acid etching solution is a mixed solution comprising hydrochloric acid and aqueous hydrogen peroxide.

20. The method according to claim 13, wherein the protective film is removed with an alkaline solution.

21. The method according to claim 13, wherein the protective film comprises a lower protective film, and further comprises an upper protective film on the lower protective film.

22. The method according to claim 21, wherein the upper protective film is formed of a novolac resin.

23. The method according to claim 13, wherein the semiconductor device is a light emitting element.

24. The method according to claim 13, wherein the first electrode is provided above a rear surface of the semiconductor substrate.

25. The method according to claim 24, wherein the second electrode is provided above the light emitting layer.

26. The method according to claim 24, wherein the second electrode is provided above the rear surface of the semiconductor substrate.

27. The method according to claim 13, wherein $R^3$ in the general formula (1) is an alicyclic group selected from the group consisting of adamantane, norbornane, and a cyclohexane ring.

28. The method according to claim 13, wherein $R^3$ in the general formula (1) is an aromatic group selected from the group consisting of benzene and a naphthalene ring.

29. The method according to claim 13, wherein $R^4$ in the general formula (1) is selected from the group consisting —OH, —COOH and =O.

30. The method according to claim 13, wherein the acid etching resistance material is a copolymer and further comprises a repeating unit represented by the following general formula (1'):

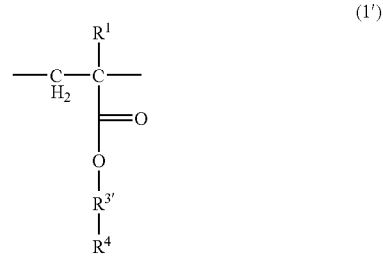

wherein in the general formula (1'), $R^1$ is a hydrogen atom or methyl group; $R^{3'}$ is a cyclic group; and $R^4$ is a polar group.

31. The method of claim 30, wherein $R^{3'}$ in the general formula (1') is an alicyclic group.

32. The method according to claim 31, wherein the alicyclic group is selected from the group consisting of adamantane, norbornane, and a cyclohexane ring.

33. A method of manufacturing a semiconductor device having a roughened surface comprising a semiconductor substrate; a first electrode; a light emitting layer formed above the semiconductor substrate; and a second electrode; said method comprising:

forming a lower protective film above part of surfaces of the semiconductor device using a first solution comprising a first solvent and an acid etching resistance material, the semiconductor device having an exposed surface, the lower protective film being insoluble to a second solvent, the acid etching resistance material having a repeating unit represented by the following general formula (1):

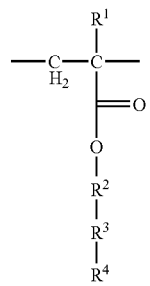
(1)

wherein in the general formula (1), $R^1$ is a hydrogen atom or methyl group; $R^3$ is a cyclic group selected from the group consisting of an alicyclic group and an aromatic group; $R^4$ is a polar group; and $R^2$ is a group represented by the following general formula (2):

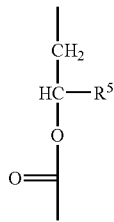
(2)

wherein in the general formula (2), $R^5$ is a hydrogen atom or methyl group;

forming an upper protective film using a second solution comprising the second solvent on the lower protective film, thereby obtaining a protective film formed of a laminated structure comprising the lower protective film and the upper protective film;

immersing the semiconductor device into an acid solution, thereby etching the exposed surface of the semiconductor device to form the roughened surface; and removing the protective film.

34. The method of claim 33, wherein the second solvent comprises propyleneglycol monomethyl ether acetate.

35. The method of claim 33, further comprising dicing the semiconductor substrate prior to immersing the semiconductor device into the acid solution and the exposed surface is a side surface of the semiconductor substrate.

36. The method of claim 33, wherein the acid solution in which the semiconductor device is immersed is concentrated hydrofluoric acid.

37. The method of claim 33, wherein the upper protective film is formed of a novolac resin.

38. The method of claim 33, wherein $R^3$ in the general formula (1) is an alicyclic group selected from the group consisting of adamantane, norbornane, and a cyclohexane ring.

39. The method of claim 33, wherein the acid etching resistance material is a copolymer and further comprises a repeating unit represented by the following general formula (1'):

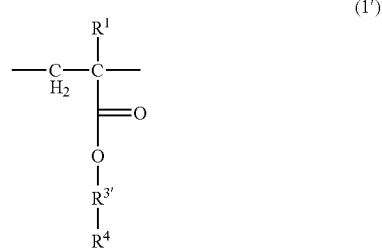
(1')

wherein in the general formula (1'), $R^1$ is a hydrogen atom or methyl group; $R^{3'}$ is a cyclic group, and $R^4$ is a polar group.

* * * * *